United States Patent
Yamanaka et al.

(10) Patent No.: US 7,110,425 B2
(45) Date of Patent: Sep. 19, 2006

(54) LASER MODULE AND PRODUCTION PROCESS THEREOF

(75) Inventors: Fusao Yamanaka, Kanagawa (JP); Yoji Okazaki, Kanagawa (JP); Kazuhiko Nagano, Kanagawa (JP); Teruhiko Kuramachi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 304 days.

(21) Appl. No.: 10/405,931

(22) Filed: Apr. 3, 2003

(65) Prior Publication Data

US 2003/0214987 A1 Nov. 20, 2003

(30) Foreign Application Priority Data

| Apr. 3, 2002 | (JP) | ............................. 2002-101714 |
| Jun. 7, 2002 | (JP) | ............................. 2002-166481 |
| Sep. 30, 2002 | (JP) | ............................. 2002-287300 |

(51) Int. Cl.
  *H01S 3/30* (2006.01)
  *H01S 3/04* (2006.01)

(52) U.S. Cl. ........................................ 372/5; 372/43.01

(58) Field of Classification Search ...................... 372/5
    See application file for complete search history.

(56) References Cited

U.S. PATENT DOCUMENTS 4,477,730 A * 10/1984 Fukuda et al. .......... 250/504 R

| 5,392,305 | A | | 2/1995 | Jakobson |
| 5,629,952 | A | * | 5/1997 | Bartholomew et al. ........ 372/33 |
| 6,546,030 | B1 | * | 4/2003 | Sasao ............................ 372/36 |
| 2002/0090172 | A1 | | 7/2002 | Okazaki et al. |

FOREIGN PATENT DOCUMENTS

| JP | 11-54852 | 2/1999 |
| JP | 11-87814 | 3/1999 |
| JP | 11-167132 | 6/1999 |
| JP | 2001-177166 | 6/2001 |
| JP | 2002-202442 | 7/2002 |

* cited by examiner

*Primary Examiner*—Armando Rodriguez
(74) *Attorney, Agent, or Firm*—Sughrue Mion, PLLC

(57) ABSTRACT

In a disclosed laser module, a usage amount of organic adhesive is set to no more than 1.0 g/ml. Thus, an equilibrium density of outgas components from the adhesive after an air removal treatment is less than 1000 ppm. In another laser module, a heat sink at which a semiconductor laser element is adhered on a submount, an electrode terminal wire-connected with the laser element, a photodiode wire-connected with the electrode terminal, and a zeolite adsorbent are fixedly provided on a stem. These are ring-welded in a container in a dry air atmosphere (80% nitrogen, 20% oxygen). In still another laser module, sixteen multiplexed lasers are disposed in a container. The container is connected with an air circulation apparatus, which is provided with a filter for removing contaminants, a rotary pump for circulating inert gas, and a valve for controlling replenishment of the gas.

13 Claims, 18 Drawing Sheets

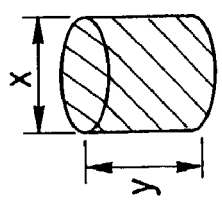
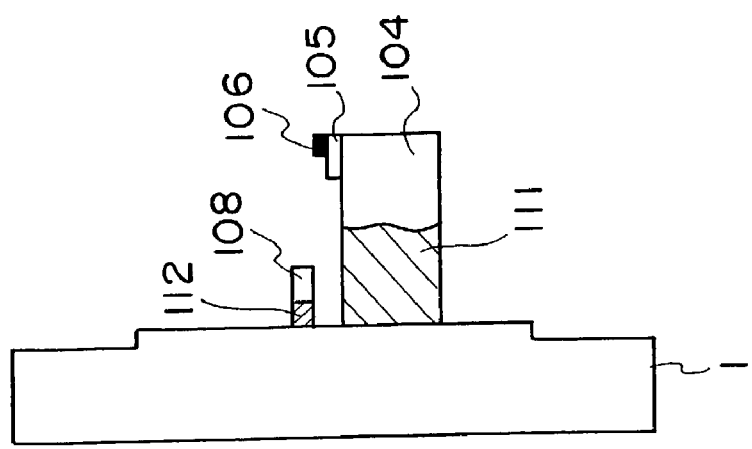
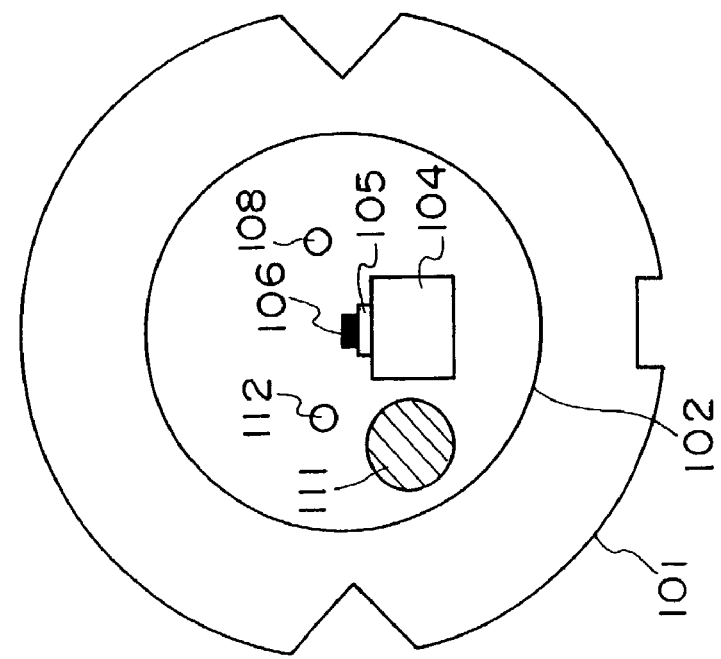

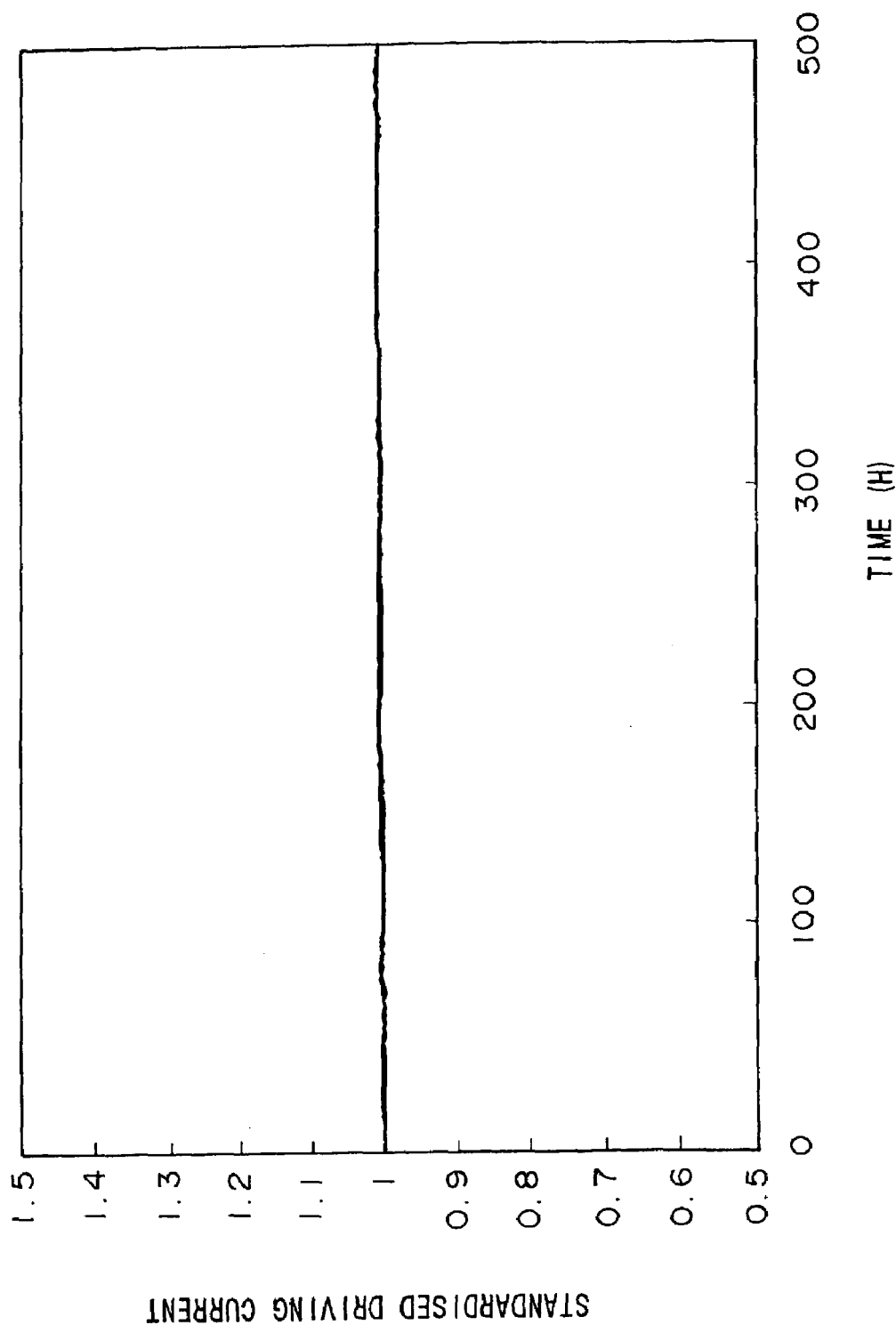

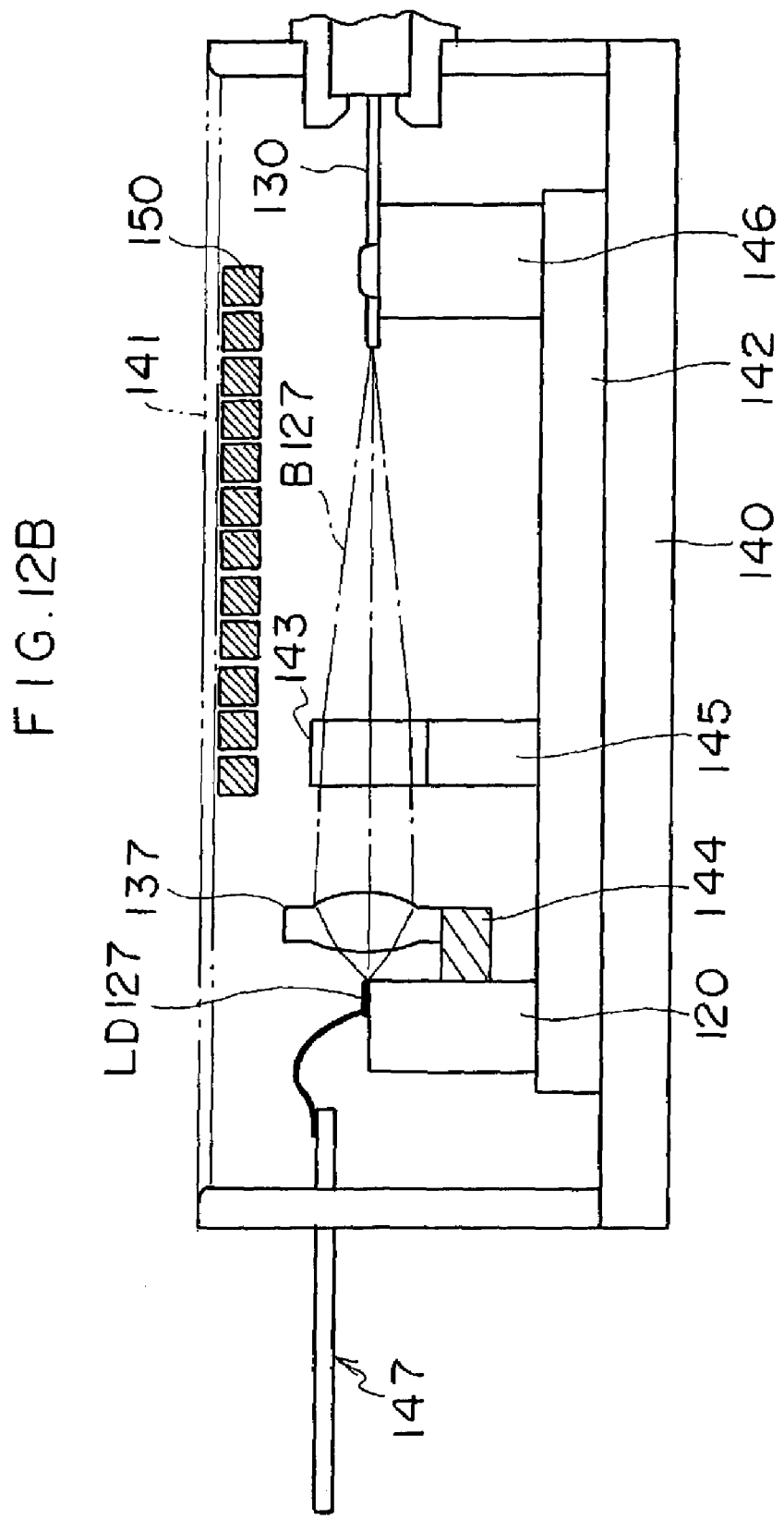

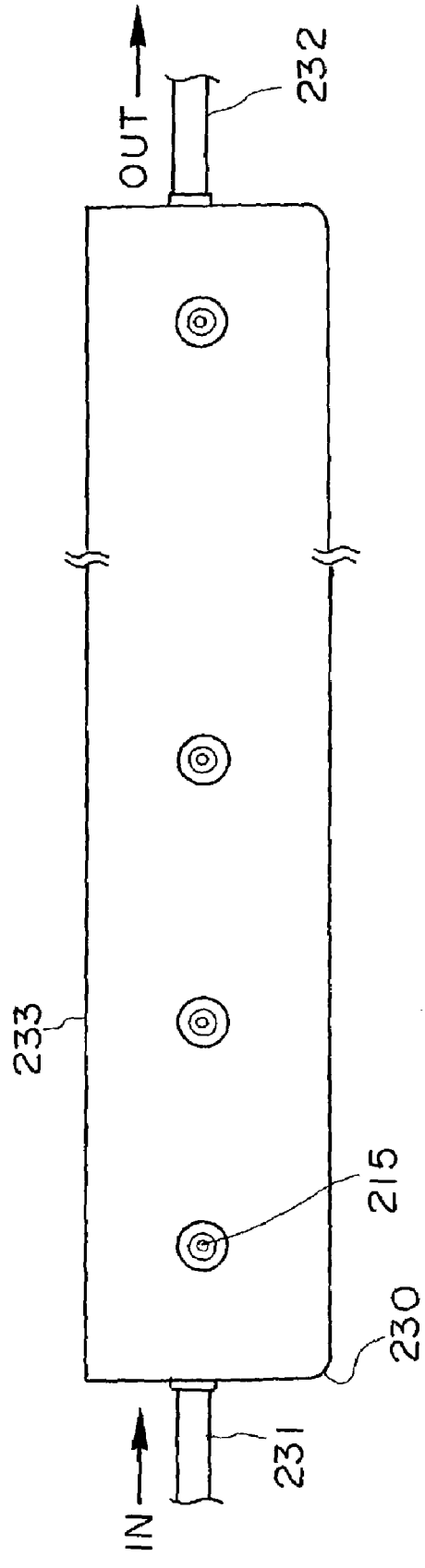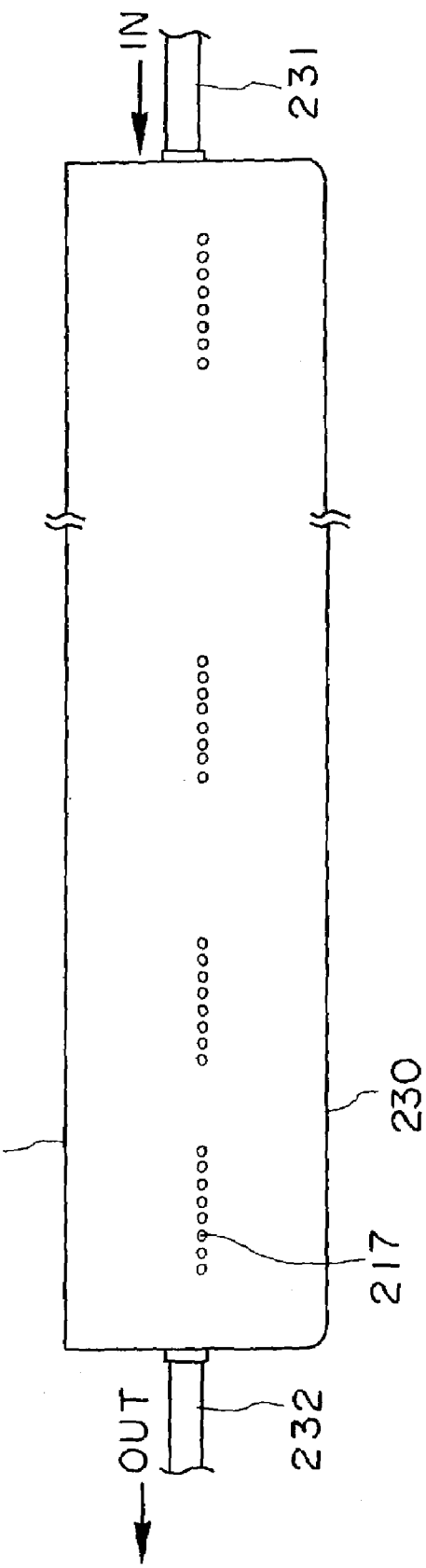

LASER MODULE AND PRODUCTION PROCESS THEREOF

BACKGROUND OF THE INVENTION

1. Field of the Invention

The present invention relates to a laser module and a production process thereof, and particularly to a laser module in which structural members including a semiconductor laser with an oscillation wavelength of 350 to 450 nm are hermetically sealed, and a production process thereof.

Further, the present invention relates to a laser module in which a semiconductor laser element is disposed in a hermetic container.

Further yet, the present invention relates to a laser device which multiplexes laser beams emitted from a plurality of semiconductor laser elements to an optical fiber by use of a condensing optical system.

2. Description of the Related Art

Heretofore, in optical modules which irradiate or emit ultraviolet rays with a wavelength of 400 nm or less, optical losses of optical components included in optical modules have increased due to the irradiated or emitted ultraviolet rays, and there has been a problem with characteristics of the optical components deteriorating. Such optical losses are thought to occur because moisture, oils and the like in the atmosphere are broken down by the ultraviolet rays, and decomposed components thereof are deposited on surfaces of the optical components.

Accordingly, in an ultraviolet ray-irradiating optical system described in Japanese Patent Application Laid-Open (JP-A) No. 11-167132 and the like, an atmosphere in which optical components are disposed (a sealed atmosphere) is nitrogen with a high purity of 99.9% or more, dry air with a high purity of 99.9% or more, air with a moisture content of not more than 0.1%, air with 0.1% or less of hydrocarbon compounds, or the like. Thus, the deposition of decomposition components is avoided, and a reduction in the output of ultraviolet laser light is prevented.

When sealed atmospheres of modules containing semiconductor lasers with oscillation wavelengths of 350 to 450 nm have been analyzed, numerous compounds have been found to be included in the sealed atmospheres. Among these compounds, particular organic gas components, which are generated from solid organic materials and adhere to optical members, mechanical members and the like that are employed in the module, are principally responsible for deterioration of laser characteristics.

In conventional laser modules, laser elements and optical systems are fixed. For this purpose, organic adhesives and the like are employed, such as, for example, epoxy-based adhesives such as an adhesive disclosed in JP-A No. 2001-177166, NOA61 manufactured by NORLAND and the like. In addition, many of the solid organic materials that adhere to optical members, mechanical members and the like used in the module are mixed in with the sealed atmosphere in a module fabrication process. Thus, even if scrubbing is implemented, organic residues occur. Organic gas is generated from the solid organic materials, and the generated gas (known as "outgas") fills the sealed laser module in a certain amount. Depending on the types of the solid organic materials, compounds including silicon atoms, phosphorus atoms, sulfur atoms and the like may be contained in this outgas.

Further still, in a sealing process, small molecules and low boiling point organic gas components of solvents and the like which are employed for washing components that structure interior portions of the module are mixed in with the sealed gas, and act as impurities. Such solvents include isopropyl alcohol (molecular weight 60.10, boiling point 82.4° C.) and acetone (molecular weight 58.08, boiling point 56.1 to 56.5° C.). The sealed gas may be dry nitrogen, dry air or the like.

Consequently, the organic gas components that are generated from the solid organic materials (below referred to as "outgas components") and the organic gas components that are mixed in during the sealing process (below referred to as "impurity components") are present in the sealed atmosphere. When these respective components are analyzed by gas chromatography, distributions of molecular weights and boiling points of the respective components are clearly different, as shown in FIGS. 5 and 6.

FIG. 5 is a distribution with respect to molecular weight for the impurity components and the outgas components respectively, with index amounts of components detected by a GC-MASS (a gas chromatograph mass spectrometer) being set to 100%. FIG. 6 is a distribution of boiling points of the components detected by the GC-MASS shown as a distribution of boiling point proportions, with total amounts for the impurity components and the outgas components being respectively set to 100%.

Thus, the molecular weights of the outgas components are distributed in a range of 70 and greater and, the molecular weights of the impurity components are distributed in a range below 70. While the boiling points of the outgas components are distributed in a range of 70° C. and upward, the boiling points of the impurity components are distributed in a range of less than 100° C.

Next, a relationship between density of the aforementioned two types of organic gas in the sealed atmosphere and a rate of deterioration of the module will be described for a laser module. This laser module has the same structure as a laser module shown in FIGS. 1 to 4, which is described later, except with regard to the employment of organic adhesive. Results are shown in FIG. 7. The rate of deterioration of the module is expressed by an amount of increase, per one hour of driving, in a current that is required for driving all elements in a case in which each light emission point of the laser module is driven at 100 mW.

The plot of black diamonds shows a relationship between density of outgas components and the rate of deterioration of the module, and the plot of white squares shows a relationship between density of impurity components and the rate of deterioration of the module. The density of the impurity components was varied by manual adjustment of a density of acetone in the sealed gas.

As can be seen from FIG. 7, the rate of increase in the driving current rises sharply when the density of the outgas components in the sealed atmosphere goes above 1000 ppm, and the deterioration of the module accelerates remarkably. It is assumed that a cause of this rapid acceleration is solid components, which are generated by optical decomposition of the outgas components, being deposited on surfaces of light-emitting portions, optical components and the like that are contained in the module.

However, even when the density of the impurity components goes above 1000 ppm, deposition of solid components on the light-emitting portions and optical components contained in the module is not observed. This is because, even when the impurity components are optically decomposed, the decomposed materials are not solid at usual temperatures, and thus will not be deposited. Even when the acetone impurity component was substituted with isopropyl alcohol, deposition of solid components was not observed, the same as with acetone.

Now, laser modules in which a main laser device, a collimator lens, a condensing lens, an optical fiber and the like are sealed in a hermetic container are also known. In these laser modules, contaminant materials that remain in the sealed container adhere to optical components, such as an emission end face of a semiconductor laser element, the lenses and the optical fiber, and the like, and there is a problem with laser characteristics deteriorating. The contaminant materials include hydrocarbon compounds that are mixed in with an atmosphere during a fabrication process. It is known that these hydrocarbon compounds are polymerized or decomposed by laser light, and then adhere.

Various methods have been proposed to solve this problem, as shown below. For example, JP-A number 11-167132 discloses that, in order to prevent a reduction in output of laser light at 400 nm or less, it is effective to set the amount of hydrocarbon compounds in the container to be 0.1% or less, and deposition of optically decomposed components of the hydrocarbon compounds on the optical components and the like can be consequently prevented. Further, it has been proposed that the sealed atmosphere be dry air. Hence, an effect of deposited matter being eliminated by photochemical reactions of oxygen in the atmosphere with the deposited hydrocarbon compounds can be expected.

Further, U.S. Pat. No. 5,392,305 discloses, in order to prevent the adherence of hydrocarbon compounds on semiconductor laser end faces due to optical decomposition of hydrocarbon-based gases, mixing at least 100 ppm of oxygen in with the sealed gas, for the purpose of decomposing the hydrocarbon-based gases.

Further still, JP-A No. 11-87814 discloses that it is possible to assure long-term reliability by degreasing and scrubbing, to remove contaminant materials such as oils and the like.

Patent Application No. 2000-336850, from the present applicant, proposes a laser module which employs a GaN-type semiconductor laser element having an oscillation wavelength of 350 to 450 nm. However, because the energy of short wavelength laser light is high, hydrocarbon-based gases that are present in the module are polymerized or decomposed, and a rate of adherence to an end face of the semiconductor laser element, optical components and the like is high, which is particularly problematic.

Hydrocarbon-based deposits that are generated by reactions between laser light and hydrocarbon compounds are, as illustrated in the aforementioned U.S. Pat. No. 5,392,305, eliminated by being decomposed to $CO_2$ and $H_2O$ with a gas atmosphere which includes oxygen in at least a certain amount.

However, such deposits are not just hydrocarbon compounds; the presence of silicon compounds has also been confirmed. Thus, it has been found that these deposits cannot be decomposed and eliminated merely by including oxygen in the atmosphere. Deposited silicon compounds are generated by photochemical reactions between laser light and organic compound gases that include silicon (below referred to as organic silicon compounds), such as siloxane combinations (Si—O—Si), silanol groups (—Si—OH) and the like. In addition, the presence of oxygen in the atmosphere has the effect of increasing reaction rates of these reactions. Because the deposits of hydrocarbon compounds and silicon compounds are generated by optical absorption, there is a problem in that reliability over time is greatly degraded by continuous oscillation.

Silicon compounds as referred to herein represent any silicon compounds having structures which include silicon, whether organic or inorganic, and include inorganic silicon oxides and organic silicon compounds.

A principal source of generation is gases that are generated from silicone members which are employed at arbitrary locations in a laser module production process. These gases may adhere to surfaces of each component inside the laser module. Furthermore, small amounts of these gases are included in the sealed gas when the module is sealed and employed. As methods for eliminating gas components in these processes, operation in a usual clean room, disposition in a sealed gas purification device and the like are available. However, even with these methods, such gases cannot be completely eliminated, and large investments in equipment are required. Even if a degreasing process is undergone as described in JP-A No. 11-87814, it is impossible to completely avoid mixing in of the aforementioned compounds from the atmosphere of the production process.

It is possible to remove the gases of hydrocarbon compounds and silicon compounds that adhere to the components in the laser module by decomposing and vaporizing the gases with a heat treatment at a temperature of 200° C. or more, preferably at least 300° C. However, this heat treatment requires a treatment duration of several hours or several tens of hours, and if the components in the module are fixed with an organic adhesive, mechanical characteristics of the adhesive will deteriorate due to thermal degradation. Therefore, this method cannot be employed.

Also, as devices which emit ultraviolet region laser beams, a multiplex laser light source which is capable of raising output and an exposure light source which is formed of a plurality of such multiplex laser light sources have been proposed. This multiplex laser light source is equipped with a plurality of semiconductor laser elements in a hermetic container, a single multimode optical fiber, and a condensing optical system which focuses laser beams emitted from the plurality of semiconductor laser elements on the multimode optical fiber.

In the multiplex laser light source described above, organic gases, which are generated from small particles present in the container and from adhesive of the respective members and the like, and/or hydrocarbon compounds, which are mixed in during fabrication, adhere to emission end faces of the semiconductor laser elements, lenses, an incidence end face of the optical fiber and the like. This causes a problem with deterioration of laser characteristics. It is known that the hydrocarbon compounds are particularly subject to polymerization and/or decomposition by laser light of short wavelengths, and that increases in output are disrupted by adherence of the polymerized and/or decomposed materials. Furthermore, because the container is hermetically sealed, the density of organic gases in the container is increased by increases in temperature and the like, and there is a problem that adhering amounts are further increased.

Furthermore, it has been found that low molecular weight siloxanes that are suspended in air react with oxygen in a photochemical reaction due to the ultra-violet rays, and are deposited and adhered at an optical glass window component in the form of silicon oxides. Accordingly, periodic replacement of a "window" member that contacts the external atmosphere is recommended.

In order to solve such problems, it has been proposed to mix at least 100 ppm of oxygen in with the sealed gas, for the purpose of decomposing hydrocarbon compounds to carbon dioxide and water.

Further, for an optical system which irradiates ultraviolet light of 400 nm or less at optical components, it has been proposed to make the atmosphere of the optical system at least 99.9% nitrogen (by volume).

Further still, degreasing and scrubbing of oil contents and the like in laser devices has been proposed.

In the case of the exposure light source using a plurality of multiplex laser light sources as described above, adjustment of the atmosphere at each container causes an increase in processing and/or fabrication inconsistencies, and leads to an increase in costs.

Further yet, at the hermetically sealed container, in order to improve the hermiticity, KOVAR™ (an alloy of iron, nickel and cobalt), which has substantially the same coefficient of thermal expansion as the container material, is employed as an adhesive for attaching electrode terminals to the container. However, because kovar is expensive, in the case of an exposure light source that uses a plurality of multiplexed laser light sources, there is a problem that costs rise in accordance with the increase in the number of multiplex laser light sources.

Now, Patent Application No. 2002-101722 from the present applicant discloses that it has been found that, in a module which includes a semiconductor laser element with an isolation wavelength of 350 to 450 nm, if the density of oxygen in the sealed atmosphere becomes excessively high, laser characteristics deteriorate accordingly.

Using a laser module for which a well-known scrubbing process has been implemented, and in which the oscillation wavelength of a semiconductor laser element employed in the laser module is switched between 410 nm, 810 nm and 980 nm, it has been evaluated how reliability varies in accordance with oxygen density in the sealed atmosphere. With the laser module using the semiconductor laser element with a wavelength of 410 nm, an effect of improvement in laser characteristics in accordance with an increase in oxygen density, with a rate of deterioration of the module over time being dependent on the oxygen density, as was exhibited by the modules that used infra-red wavelengths of 810 nm and 980 nm, was not observed.

That is, for laser light of the infra-red wavelengths 810 nm and 980 nm, a decomposition reaction of hydrocarbon compounds that are deposited on optical component surfaces on the optical path of the laser, such as a fiber incidence end surface, a lens and the like in the module, which is understood to improve reliability over time, becomes more active with an increase in oxygen density. In contrast, for laser light with a wavelength of 410 nm, reliability conversely deteriorated when oxygen density was 100 ppm or greater.

This is because, in the range of oxygen density of 100 ppm or more, deposition of silicon-based compounds at a fiber end face focus portion became remarkable. Similarly to the hydrocarbon compounds, optical absorption occurred at these deposits of silicon-based compounds. Thus, reliability over time was extremely adversely affected by continuous oscillation.

That is, the hydrocarbon deposits generated by reaction of the laser light with the hydrocarbon gases are decomposed to carbon dioxide ($CO_2$) and water ($H_2O$) in a gas atmosphere that includes oxygen in at least predetermined amounts, and thus eliminated. However, in addition to the hydrocarbons, silicon compounds are also included in the deposits. These deposits of silicon compounds cannot be decomposed or eliminated merely by including oxygen in the atmosphere. The deposited silicon compounds are generated by photochemical reactions of the laser light with organic compound gases that include silicon (Si) atoms (below referred to as organic silicon compounds), such as in siloxane combinations (Si—O—Si), silanol groups (—Si—OH) and the like. Moreover, the presence of oxygen in the atmosphere accelerates the reaction rates of these photochemical reactions.

The silicon compounds referred to herein include inorganic silicon oxides (SiOx), organic silicon compounds, silicon carbide compounds, organic silicon carbide compounds and the like, which are compounds having structures which, whether organic or inorganic, respectively include silicon atoms. Further, the organic silicon compound gases are gases which are generated from silicone-related materials which are employed at arbitrary locations during a module production process. If these gases adhere to surfaces of respective components in the module, small amounts of the organic silicon compound gases are included in the sealed atmosphere when the module is sealed and employed.

The gas components that are present during the production process cannot be completely eliminated simply by equipping a usual clean room with a sealed gas purification device. In order to eliminate this gas, large investments in equipment are necessary. Moreover, even if well-known degreasing and scrubbing processes are implemented, it is impossible to prevent organic silicon compound gas from being mixed in with the atmosphere of fabrication processing.

Thus, as described above, even in a case in which oxygen is included in a sealed atmosphere in order to prevent deposition of hydrocarbon compounds, if the oxygen content is too great, then deposition of silicon compounds will increase, laser characteristics will deteriorate, and reliability will become poor. Moreover, a fiber incidence end face and optical components such as lenses and the like inside the module are fixed with adhesive, wax or the like, and it is not possible to replace these.

SUMMARY OF THE INVENTION

The present invention has been devised in light of the circumstances described above, and one object of the present invention is to provide a high reliability laser module which effectively suppresses deterioration of laser characteristics and a production process for producing this laser module.

In order to achieve the object described above, a laser module of a first aspect of the present invention includes the following semiconductor laser and hermetic sealing member. The semiconductor laser emits laser light in a wavelength range of 350 to 450 nm. The hermetic sealing member forms a sealed space charged with a sealed atmosphere in which a density of organic gas components generated from solid organic matter inside the hermetic sealing member is less than 1000 ppm, and the semiconductor laser is hermetically sealed in the space.

In this laser module, the hermetic sealing member includes the space which is charged with the sealed atmosphere in which the density of organic gas components generated from the solid organic matter in the space is less than 1000 ppm. The semiconductor laser which emits laser light in the wavelength range of 350 to 450 nm is hermetically sealed in the space. Thus, because this sealed atmosphere is set such that density of the organic gas components generated from the solid organic material (outgas components) is less than 1000 ppm, decomposition deposits generated by reaction of the organic gas components with the laser light are reduced, and deterioration of laser characteristics is effectively suppressed. Consequently, a laser module with high reliability can be provided.

Further, in order to achieve the above-described object, a laser module of a second aspect of the present invention includes the following multiplex laser and hermetic sealing member. The multiplex laser includes a plurality of semiconductor lasers which emit laser light in a wavelength range of 350 to 450 nm, a single optical fiber, and a condensing optical system which condenses laser beams respectively emitted from the plurality of semiconductor lasers and focuses the same on the optical fiber. The hermetic sealing member forms a sealed space charged with a sealed atmosphere in which a density of organic gas components generated from solid organic matter inside the hermetic sealing member is less than 1000 ppm. The semiconductor lasers, a focusing side portion of the optical fiber, and the condensing optical system are hermetically sealed in the space.

The laser module of the second aspect includes a multiplex laser which condenses the laser beams in the wavelength range of 350 to 450 nm that are respectively emitted from the plurality of semiconductor lasers with the condensing optical system and focuses the laser beams at the single optical fiber. Further, the hermetic sealing member includes the space which is charged with the sealed atmosphere in which the density of organic gas components generated from the solid organic material in the space is less than 1000 ppm. The semiconductor lasers, optical fiber focusing side portion and condensing optical system, which structure the multiplex laser, are hermetically sealed in this space. Thus, because the sealed atmosphere is set such that the density of the organic gas components emitted from the solid organic material is less than 1000 ppm, decomposition deposits generated by reaction of the organic gas components with the laser light are reduced, and deterioration of laser characteristics is effectively suppressed. Consequently, a laser module with high reliability can be provided.

In the invention described above, the density of organic gas components generated from the solid organic material in the sealed atmosphere can be set to less than 1000 ppm by setting the amount of solid organic matter contained in a volume to be sealed to 1 g/ml or less before hermetic sealing, and an air removal treatment is implemented before hermetic sealing. Here, solid organic material means organic materials which are solid at room temperature, such as organic adhesives and the like.

The aforementioned organic gas components generated from the solid organic material can be set to be organic gas components with a molecular weight of 70 or above and/or a boiling point of 70° C. or above. Furthermore, the organic gas components emitted from the solid organic material may include compounds which contain at least one of silicon atoms, phosphorus atoms and sulfur atoms.

Moreover, the sealed atmosphere may be an inactive gas including oxygen in a density of at least 1 ppm and at most 100 ppm. The organic gas components generated from the solid organic material are decomposed by laser light, and the decomposed material is deposited at optical components and the like. However, given the presence of oxygen in the above-described density range, these decomposed deposits are oxidized and decomposed. Thus, deterioration of laser characteristics is further suppressed.

In order to achieve the aforementioned object, a third aspect of the present invention is a laser module production process. This process includes accommodating a semiconductor laser which emits laser light in a wavelength range of 350 to 450 nm in a space inside a hermetic sealing member, setting an amount of solid organic material contained in a volume to be sealed to be 1 g/ml or less, air removal processing the space until the density of organic gas components generated from the solid organic material is less than 1000 ppm, and after this air removal processing, hermetically sealing the semiconductor laser in the space.

In this laser module production process, because the semiconductor laser which emits laser light in a wavelength range of 350 to 450 nm is accommodated in the space inside the hermetic sealing member and the amount of solid organic material contained in the volume to be sealed is set to 1 g/ml or less, the density of the organic gas component generated from the solid organic material in the sealed atmosphere can be set to be less than 1000 ppm by the deaeration processing of the space. Consequently, decomposed deposits that are generated by reaction of the organic gas components with laser light are reduced, and deterioration of laser characteristics is effectively suppressed. That is, reliability of the laser module is improved.

In light of the circumstances described earlier, another object of the present invention is to provide, for a laser module in which a semiconductor laser element is disposed in a hermetic container, a high reliability laser module from which contaminant materials have been favorably eliminated.

A laser module of a fourth aspect is a laser module in which a semiconductor laser element is disposed in a hermetic container, which laser module includes a material including a gas adsorption function, the material being disposed in the hermetic container.

The material which is disposed in the container and has the function of adsorbing the gas includes at least one of a zeolite adsorbent and activated carbon.

An optical system may be provided inside the hermetic container for inputting laser light from the semiconductor laser element to the fiber.

The oscillation wavelength of the semiconductor laser element may be 450 nm or less.

According to the laser module of the fourth aspect of the invention, the laser module has the semiconductor laser element disposed inside the hermetic container, and the material having the gas adsorption function is disposed in the hermetic container. Consequently, because hydrocarbon compounds and silicon compounds and the like are excellently adsorbed, these compounds will not be deposited at an emission end face of the semiconductor laser element and the like, and laser characteristics and reliability can be made excellent. Moreover, because a heating treatment is not required, it is possible to produce high reliability semiconductor laser elements with high efficiency.

There is no need, as in conventional technology, to carry out adjustments of the atmosphere in the sealed space, or degreasing and scrubbing treatments. Thus, fabrication processes of the module can be made simpler.

By using one or more of a zeolite adsorbent and activated charcoal as the material having the gas adsorption function, hydrocarbon compounds and the like can be excellently adsorbed. Thus, laser characteristics and reliability can be made excellent.

When a laser module of the first or second aspect of the present invention is structured to be capable of adsorbing gas, laser characteristics and reliability will be made further excellent.

For a laser module further provided with optical fiber, application of the fourth aspect of the invention is effective in enabling favorable prevention of deposition of contaminant materials at surfaces of optical system members and an input end of the optical fiber.

In particular, application of the fourth aspect of the invention is effective in the case of a semiconductor laser element with an oscillation wavelength whose oscillation wavelength is 450 nm or less, because deposition rates and deposition amounts of hydrocarbon compounds due to this short wavelength laser light are greater than in a case of laser light with a long wavelength.

In light of the circumstances described earlier, yet another object of the present invention is to provide a laser apparatus which provides high output and high reliability and can be fabricated with low costs.

A laser apparatus of a fifth aspect includes a plurality of multiplex lasers, a single container, and an air circulation apparatus. The plurality of multiplex lasers include a plurality of semiconductor laser elements, one multimode optical fiber, and a condensing optical system which condenses laser beams respectively emitted from the plurality of semiconductor laser elements and focuses the laser beams at an incidence end of the multimode optical fiber. The single container accommodates the plurality of multiplex lasers in a state in which emission ends of the optical fibers pass out to an exterior. The container includes an air exhaust port and an air supply port. The air circulation apparatus provided outside the container causes inactive gas to flow inside the container with continuous pressure. The air circulation apparatus includes an air circulation path which communicates with the air exhaust port and the air supply port. The air circulation apparatus includes a filter in the air circulation path for removing contaminant matter.

It is desirable that the inactive gas includes at least one of nitrogen, oxygen, a noble gas and a halogen-type gas. The halogen-type gas includes at least one of a halogen family gas and a halogen compound gas.

In particular, it is desirable if oxygen and a halogen-type gas are included in a gas such as nitrogen, argon or the like at a density of at least 1 ppm. It is further desirable if this density is from 1 to 100 ppm. A halogen family gas or halogen compound gas desirably includes fluorine atoms. A halogen compound gas may be one or more selected from a group consisting of respective fluorides of carbon, nitrogen, sulfur and xenon, and respective chlorides of carbon, nitrogen, sulfur and xenon.

It is desirable if resonator end faces of the semiconductor laser elements accommodated in the container, optical fiber incidence faces and outermost surface layers covering the condensing optical systems are structured with a material that is inactive with respect to the halogen family gases and halogen compound gases. This inactive material may be one or more selected from a group consisting of respective oxides of indium, gallium, aluminium, titanium and tantalum and respective nitrides of gallium, aluminium, titanium and tantalum.

The container may include an openable/closeable lid body.

The semiconductor laser elements may be formed of a GaN-related semiconductor.

According to the laser apparatus of the fifth aspect of the present invention, by being structured as described above, a laser apparatus having high output and reliability, which can be effectively fabricated at low cost, can be provided.

Specifically, because the inactive gas flows in the container continuously, adherence of contaminant materials to the respective members can be favorably prevented. Moreover, because there is no need to adjust the atmosphere with high accuracy, as in conventional technologies, a laser apparatus capable of providing high output and reliability can be provided simply and with low costs.

Because the filter for removing contaminant materials is provided on the air circulation path, contaminant materials that are contained in the hermetic container and the air circulation apparatus can be excellently removed.

With a laser apparatus in which the container has an openable/closeable lid body, when replacement of a member is required because of breakdown at one of a plurality of multiplexed lasers or the like, that member can be replaced easily. Thus, expenses and time required for maintenance can be reduced.

In a case in which a halogen-type gas with oxygen at a density of at least 1 ppm is included as the inactive gas, hydrocarbon deposits are reduced by being oxidized and decomposed, and deposits due to silicon compounds are reduced by being decomposed and eliminated by the halogen-type gas. Thus, deterioration of laser characteristics is effectively suppressed. Accordingly, a laser module with high reliability can be provided.

Structuring the resonator end faces of the semiconductor laser elements accommodated in the container, the optical fiber incidence faces and the foremost surface layers covering the condensing optical systems with the material that is inactive with respect to halogen family gases and halogen compound gases is effective for preventing deterioration of these members due to reactivity of the halogen-type gas being high.

In the laser apparatus in which the semiconductor laser elements are formed with a GaN-related semiconductor, an ultraviolet region laser beams with high energy are emitted. Accordingly, application of the present invention is particularly effective for preventing the adherence of contaminant materials therein.

BRIEF DESCRIPTION OF THE DRAWINGS

FIG. 9A is a plan view showing the laser module according to the second embodiment of the present invention.

FIG. 9B is a side view showing the laser module according to the second embodiment of the present invention.

FIG. 9C is a schematic view of a zeolite adsorbent for the second embodiment of the present invention.

FIG. 11 is a graph showing variation over time of driving current in a laser module according to the second embodiment of the present invention.

FIGS. 12A and 12B are schematic structural views showing a laser module according to a third embodiment of the present invention.

FIG. 15A is a front view showing the implementation of the laser module according to the fourth embodiment of the present invention.

FIG. 15B is a rear view showing the implementation of the laser module according to the fourth embodiment of the present invention.

DETAILED DESCRIPTION OF THE EMBODIMENTS

Herebelow, a first embodiment of the present invention will be described in detail with reference to the drawings.

Module Structure

Figure 1:
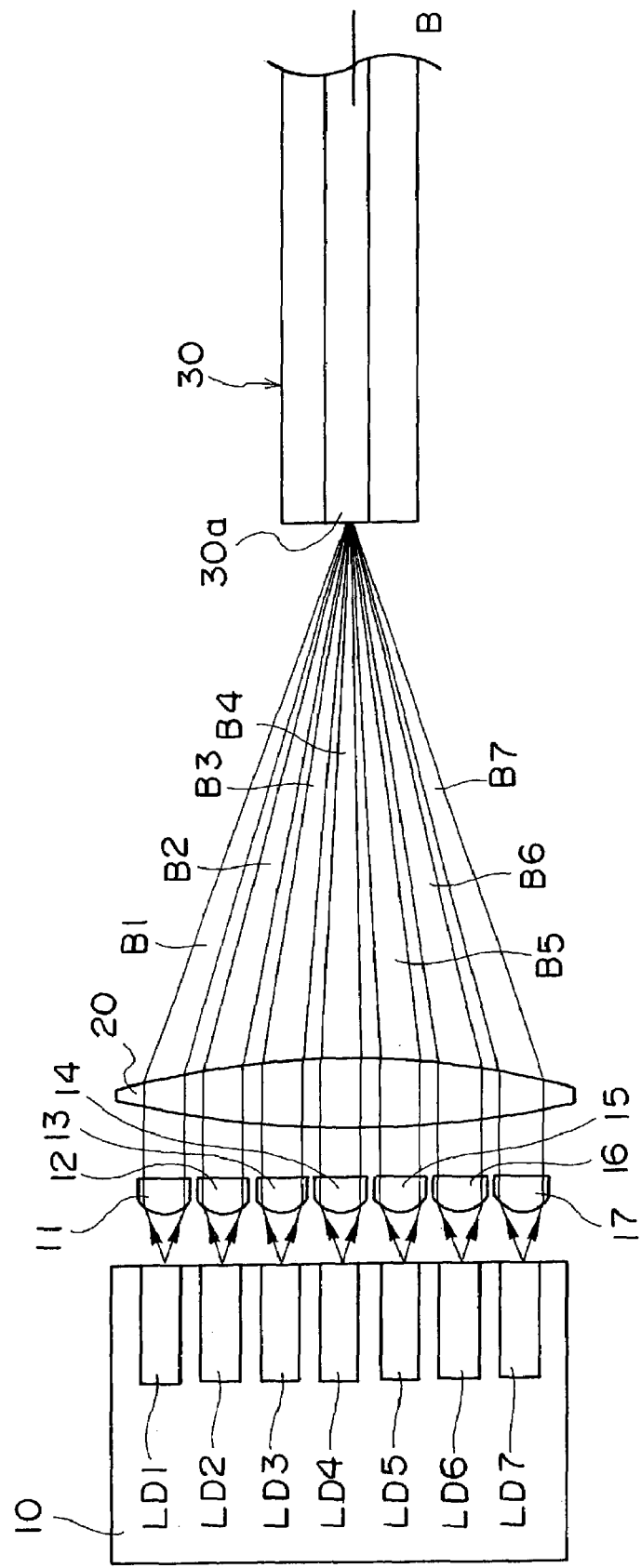
FIG. 1 is a plan view showing structure of a multiplexed laser light source of a laser module relating to a first embodiment of the present invention.

A laser module relating to the first embodiment is provided with a multiplex laser light source shown in FIG. 1. This multiplex laser light source is structured with a plurality of chip-form lateral multimode gallium-nitride (GaN)-related semiconductor lasers LD1, LD2, LD3, LD4, LD5, LD6 and LD7, collimator lenses 11, 12, 13, 14, 15, 16 and 17, a single condensing lens 20, and a single multimode optical fiber 30. The GaN-related semiconductor lasers LD1 to LD7 are fixedly arranged on a heat block 10. The collimator lenses 11 to 17 are provided in correspondence with the GaN-related semiconductor lasers LD1 to LD7, respectively.

The GaN-related semiconductor lasers LD1 to LD7 all have a common oscillation wavelength (for example, 405 nm), and a common maximum output (for example, 100 mW). For the GaN-related semiconductor lasers LD1 to LD7, lasers can be used which are provided with an oscillation wavelength different from the above-mentioned 405 nm, in a wavelength range of 350 nm to 450 nm.

Figure 2:
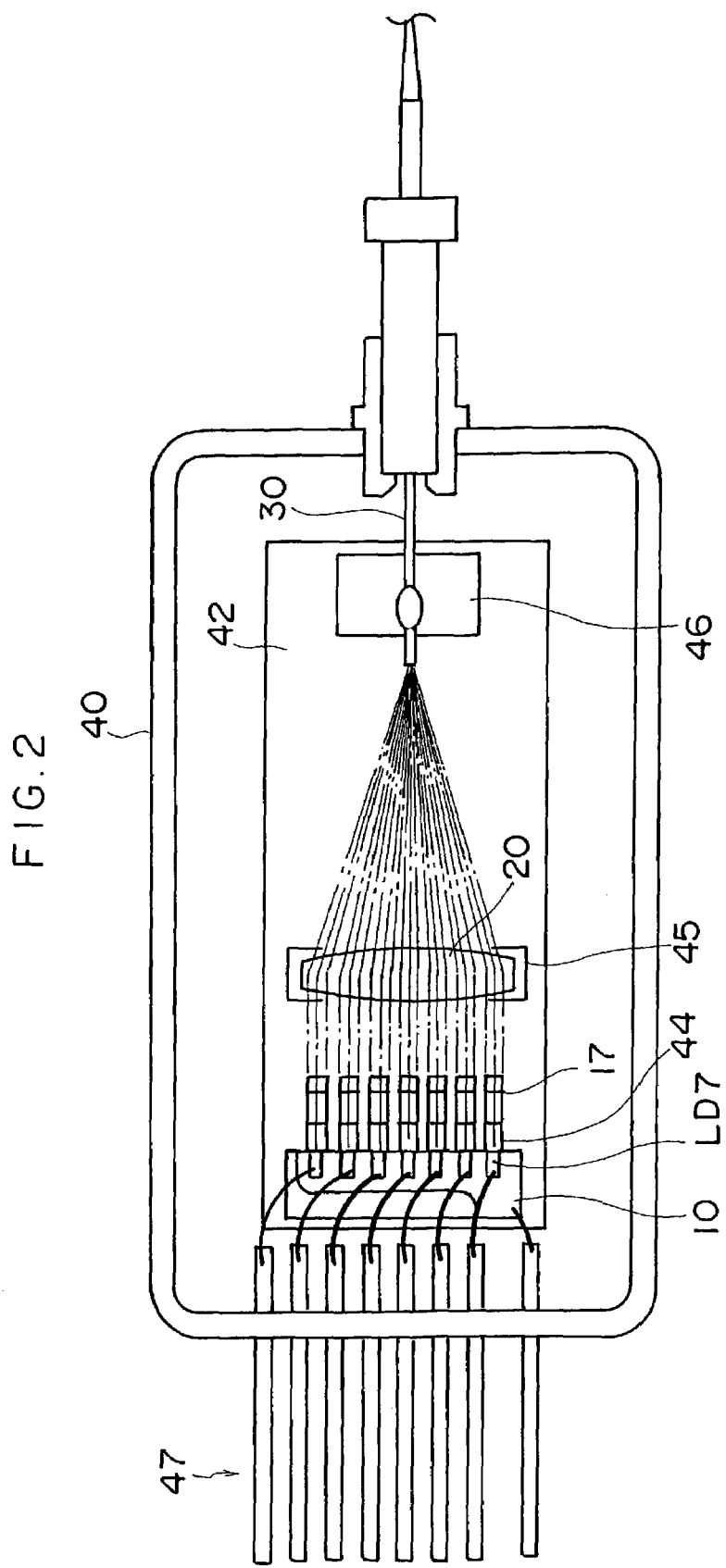
FIG. 2 is a plan view showing structure of the laser module relating to the first embodiment of the present invention.
Figure 3:
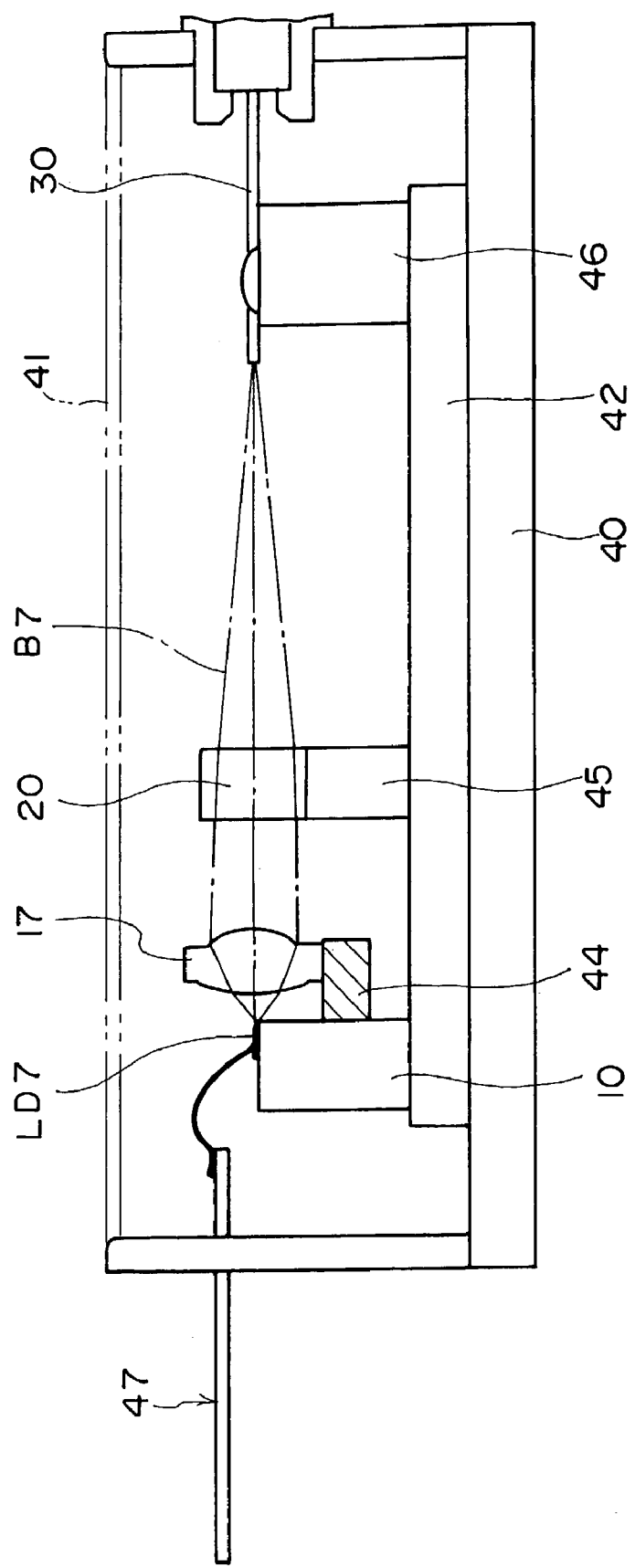
FIG. 3 is a side view showing structure of the laser module shown in FIG. 2.

As shown in FIGS. 2 and 3, the above-described multiplex laser light source, together with other optical elements, is accommodated in a box-like package 40, which opens upward. A base plate 42 is fixed at a lower face of the package 40. The heat block 10, a condensing lens holder 45 and a fiber holder 46 are attached at an upper face of the plate 42. The condensing lens holder 45 holds the condensing lens 20. The fiber holder 46 holds an incidence end portion of the multimode optical fiber 30. A collimator lens holder 44 is attached at a side face of the heat block 10, and holds the collimator lenses 11 to 17. Openings are formed in a lateral wall face of the package 40. Wiring 47, which supplies driving current to the GaN-related semiconductor lasers LD1 to LD7 is passed through these openings and led out to outside the package.

Note that in FIG. 2, in order to alleviate complexity of the drawing, of the plurality of GaN-related semiconductor lasers, only the GaN-related semiconductor laser LD7 is marked with a reference numeral, and of the plurality of collimator lenses, only the collimator lens 17 is marked with a reference numeral.

Figure 4:
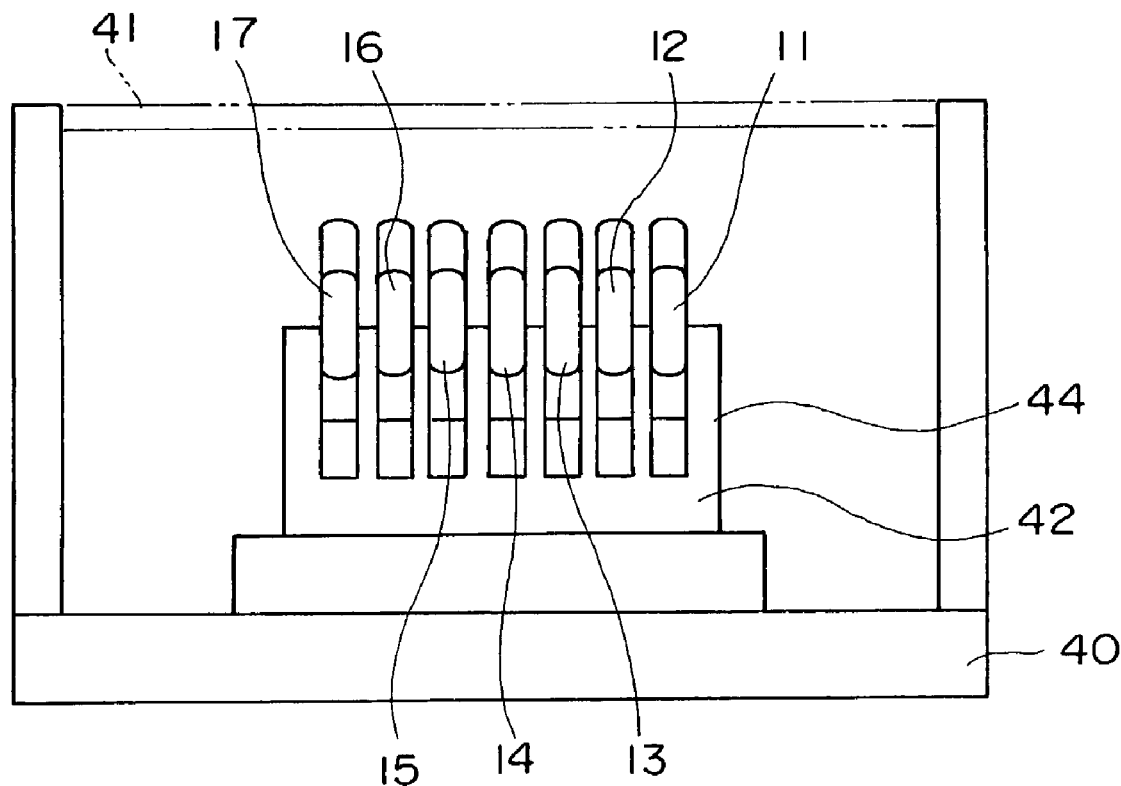
FIG. 4 is a partial side view showing structure of the laser module shown in FIG. 2.
Figure 5:
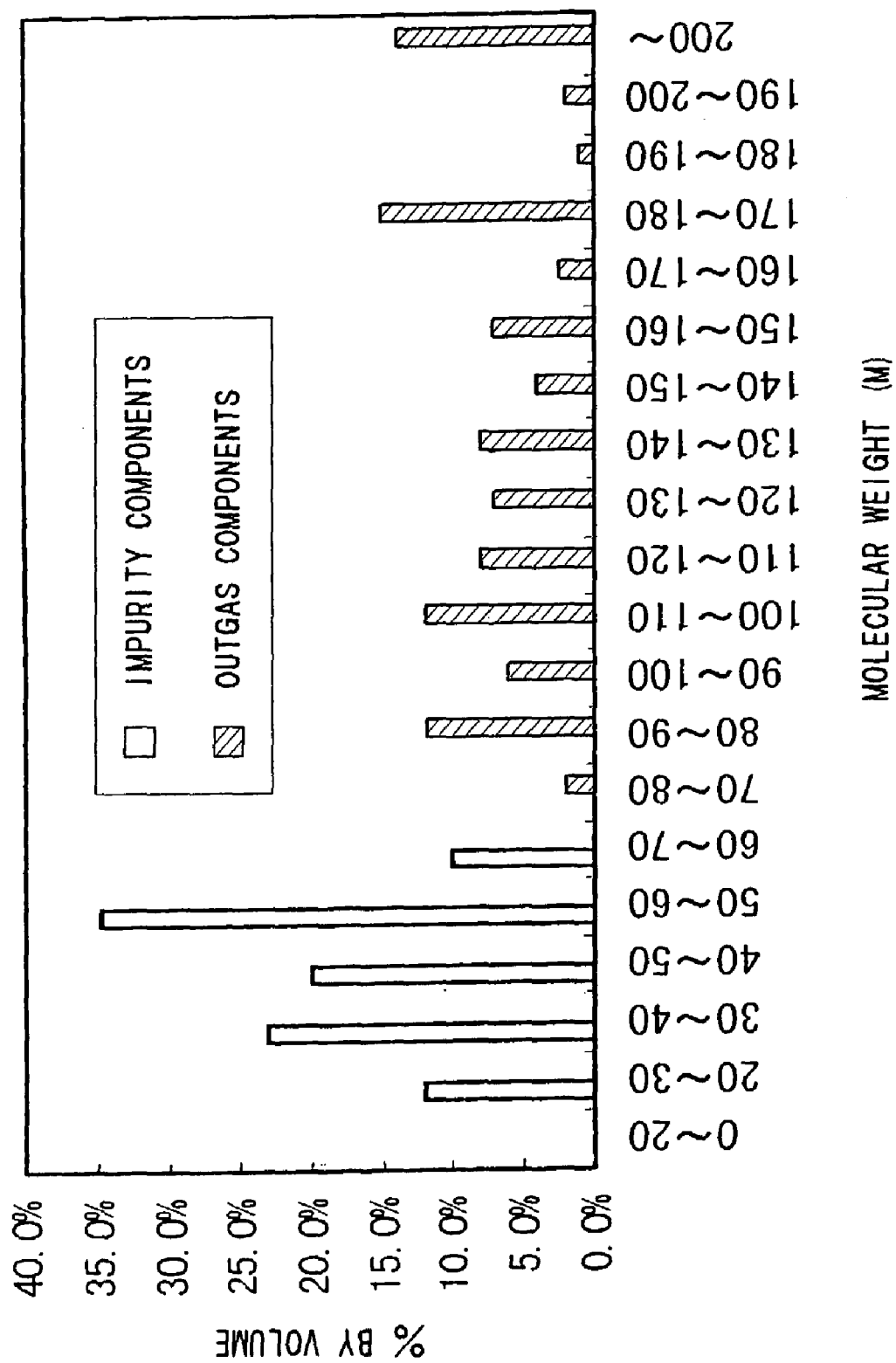
FIG. 5 is a graph showing distributions of molecular weights of outgas components and impurity components.
Figure 6:
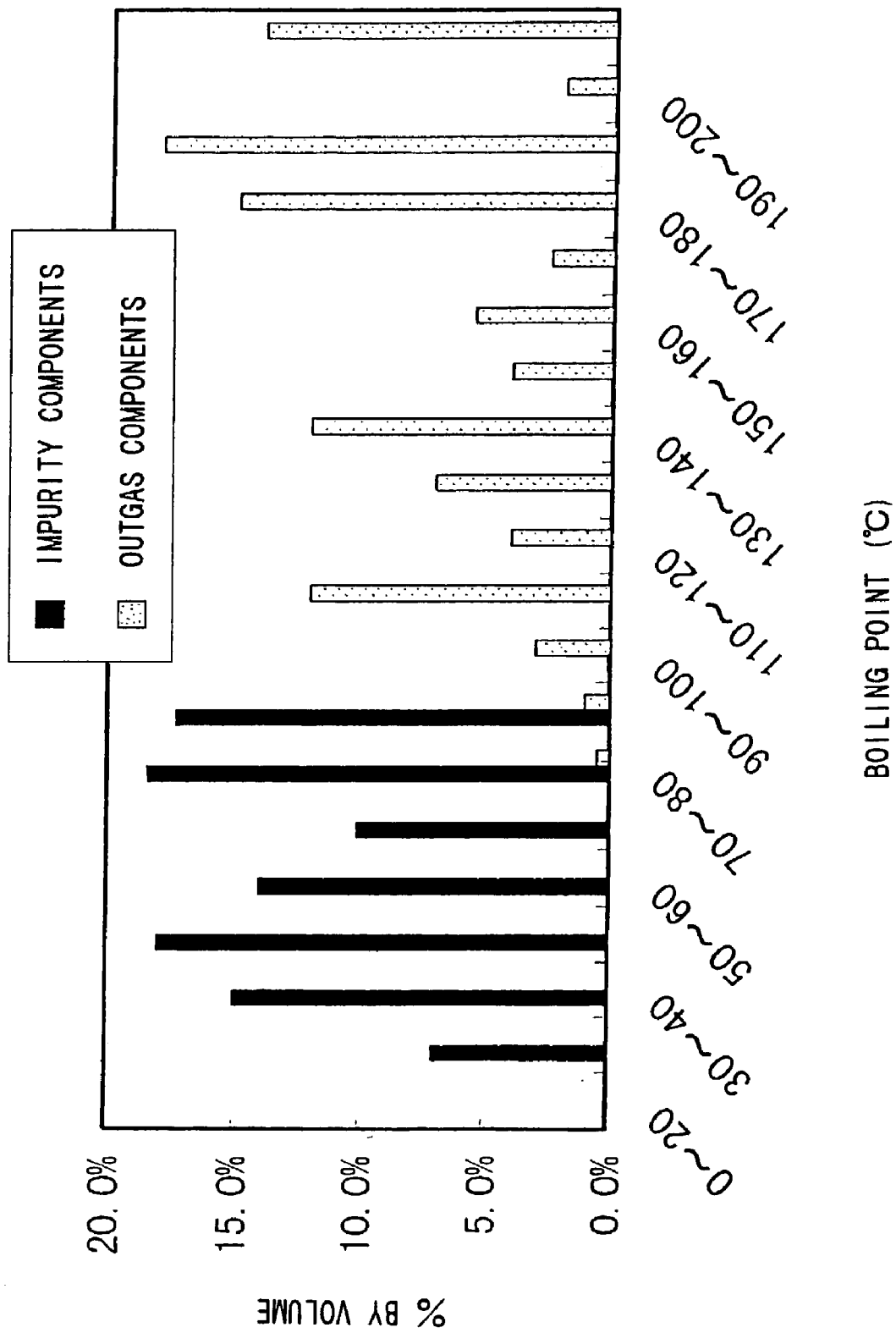
FIG. 6 is a graph showing distributions of boiling points of outgas components and impurity components.
Figure 7:
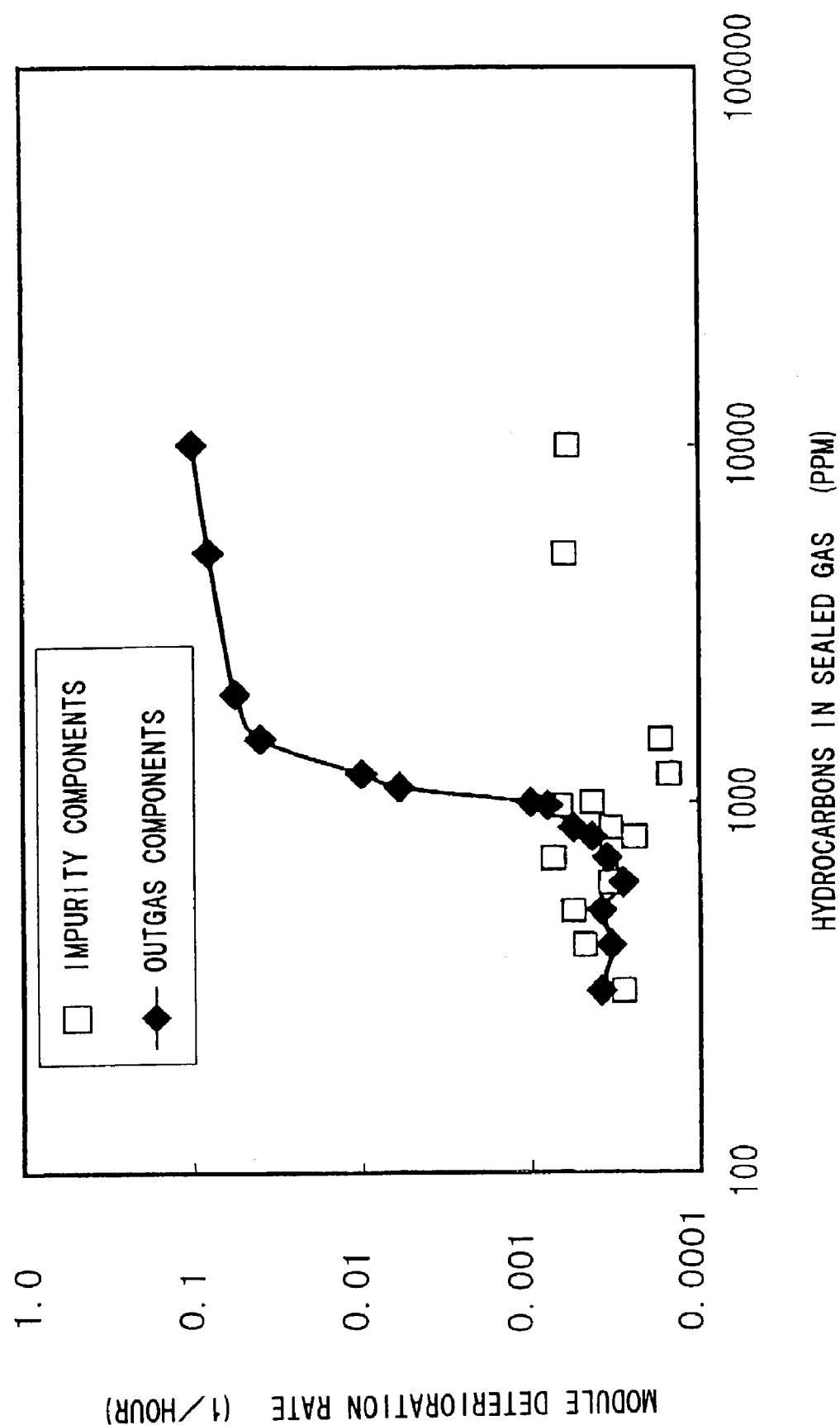
FIG. 7 is a graph showing relationships between outgas component density and impurity component density and module deterioration rates.

FIG. 4 shows front face shapes of attachment portions of the collimator lenses 11 to 17. Each of the collimator lenses 11 to 17 has a long, narrow, cut-down shape with parallel flat faces defining a region that includes an optical axis of a circular-form lens which is provided with an aspherical surface. The collimator lenses with this long, narrow shape can be formed, for example, by molding-formation of resin or optical glass. The collimator lenses 11 to 17 are closely disposed in a direction of arrangement of light emission points of the GaN-related semiconductor lasers LD1 to LD7 (the left-right direction in FIG. 4) such that the length directions of the collimator lenses 11 to 17 cross the direction of arrangement of the light emission points.

For the GaN-related semiconductor lasers LD1 to LD7, lasers may be employed which are provided with an active layer with a light emission width of 2 μm, and which respectively emit laser beams B1 to B7 in forms which widen at angles of, for example, 10° and 30° with respect, respectively, to a direction parallel to the active layer and a direction perpendicular to the active layer. These GaN-related semiconductor lasers LD1 to LD7 are disposed such that the light emission points are lined up in a single row in the direction parallel to the active layers.

Accordingly, the laser beams B1 to B7 emitted from the respective light emission points are incident on the respective collimator lenses 11 to 17 having the long, narrow forms described above in states in which the direction for which the spreading angle is greater coincides with the length direction and the direction in which the spreading angle is smaller coincides with a width direction (a direction intersecting the length direction). Specifically, the width of each of the collimator lenses 11 to 17 is 1.1 mm and the length thereof is 4.6 mm, and the laser beams B1 to B7 incident thereat have beam diameters in the horizontal direction and the vertical direction of 0.9 mm and 2.6 mm, respectively. Further, each of the collimator lenses 11 to 17 has a focusing length $f_1$=3 mm, NA=0.6 and lens arrangement pitch=1.25 mm.

The condensing lens 20 is cut away in a long, narrow shape with parallel flat faces defining a region that includes an optical axis of a circular-form lens which is provided with an aspherical surface, and is formed in a shape which is long in the direction of arrangement of the collimator lenses 11 to 17 (i.e., a horizontal direction) and short in a direction perpendicular thereto. The condensing lens 20 has a focusing distance $f_2$=12.5 mm and NA=0.3. The condensing lens 20 is also formed by, for example, molding-formation of resin or optical glass.

The multimode optical fiber 30 may be any of a step index-type optical fiber, a graded index-type optical fiber and a multiplex-type optical fiber. For example, a graded index-type optical fiber produced by MITSUBISHI CABLE INDUSTRIES, LTD. can be employed. This optical fiber has a core central portion with a graded index and an outer peripheral portion with a step index. A core diameter thereof=25 μm, NA=0.3, and transmittance of an end face coating=99.5% or more.

The package 40 is provided with a package lid 41 prepared so as to close the opening of the package 40. After a later-described air removal treatment, sealed gas is introduced and the opening of the package 40 is closed by the package lid 41. Thus, the above-described multiplex laser light source is hermetically sealed, together with other optical elements, in a closed space (sealed space) formed by the package 40 and the package lid 41.

As described earlier, deterioration of the module is accelerated if density of outgas components in the sealed atmosphere is 1000 ppm or more. Therefore, in order to suppress deterioration of the module, the hermetic sealing is such that the density of outgas components in the sealed atmosphere is less than 1000 ppm. For this purpose, for example, fixing of optical components may be not carried out with organic adhesive or the like at all, with inorganic adhesive being used for the fixing, or the like, and amounts of adhesive that are introduced may be kept to 1.0 g/ml or less.

Before the sealed gas is introduced and the hermetic sealing is implemented, an air removal treatment for exhausting the atmosphere in the sealed space is carried out. Even in a case in which an organic adhesive is used for fixing the optical system in the module, because the air removal treatment is carried out after the components have been fixed with adhesive and before the sealing, outgassing from an organic adhesive can be suppressed.

In view of not degrading mechanical characteristics of the adhesive, the air removal treatment is usually carried out at not more than 200° C. When sealing of the module is implemented and the amount of gas components included in the sealed atmosphere is measured, it is confirmed that, if the amount of adhesive that has been introduced is large, then the amount of organic gas released in the module is large, and will not be less than a certain level.

By introducing predetermined amounts of organic adhesive (solid organic matter) into a laser module, the amount per unit volume of solid organic material included in the volume to be sealed was varied between 0.5 g/ml (g/cc) and 10 g/ml, and the density of outgas components after an air removal treatment was adjusted. After an air removal treatment at 90° C. had been implemented, nitrogen gas with a purity of 99.999% or more was introduced and the laser module was hermetically sealed. The laser module was left for 24 hours, and then the density of outgas components in the sealed module was measured by gas chromatography.

If the density of the outgas components reaches a certain level, the outgas components in the sealed atmosphere will not be reduced even by further lengthening the duration of the air removal. This equilibrium state is attained because, even when air removal of un-set components of the adhesive is completed, components that form the base material of the adhesive are decomposed in the air removal process, remain in the adhesive, and are outgassed after sealing.

If the amount of organic adhesive that is introduced is 1.2 g/ml or greater, this equilibrium value is high and, even if a long-duration air removal treatment is implemented, the density of outgas components in the module is not less than 1000 ppm. However, the equilibrium density of outgas components in the module after the air removal treatment can be made to be less than 1000 ppm by setting the amount of organic adhesive that is introduced to 1.0 g/ml or less.

Even if the introduced amount of organic adhesive is set to 1.0 g/ml or less, the following conditions for achieving the equilibrium density apply: the air removal duration may be in a range from 130 to 200 hours, and the air removal temperature may be in a range from 80 to 150° C.

For the sealed gas, an inactive gas such as nitrogen or the like that has been dried, dry air or the like can be used. A sealed gas that contains very small amounts of oxygen in an inactive gas may be used. When small amounts of oxygen are included in the sealed atmosphere, deterioration of the laser module can be further suppressed. This deterioration suppression effect is obtained because the oxygen contained in the sealed atmosphere decomposes and oxidizes solid materials that are generated by photodecomposition of the outgas components. The density of oxygen in the sealed atmosphere may be in a range from 1 to 100 ppm. If the oxygen density is 100 ppm, deposits can be satisfactorily decomposed and removed even if the density of outgas components in the sealed atmosphere is in the vicinity of 1000 ppm.

Module Operation

Next, operation of the laser module described above will be described.

The respective laser beams B1, B2, B3, B4, B5, B6 and B7, which are emitted in divergent forms from the respective GaN-related semiconductor lasers LD1 to LD7 that structure the multiplex laser light source, are converted to parallel light by the collimator lenses 11 to 17. The laser beams B1 to B7 that have been collimated are focused by the condensing lens 20, and converge at an incidence end face of a core 30*a* of the multimode optical fiber 30.

In the present example, the condensing optical system is structured by the collimator lenses 11 to 17 and the condensing lens 20, and a multiplexing optical system is structured by the condensing optical system and the multimode optical fiber 30. Thus, the laser beams B1 to B7 focused by the condensing lens 20 as described above are incident at the core 30*a* of the multimode optical fiber 30, are propagated in the optical fiber, and are multiplexed and emitted from the multimode optical fiber 30 as a single laser beam B.

In the laser module described above, a coupling rate of the laser beams B1 to B7 into the multimode optical fiber 30 is 0.9. Therefore, in a case in which the respective outputs of the GaN-related semiconductor lasers LD1 to LD7 are 100 mW, the multiplexed laser beam B can be obtained with an output of 630 mW (=100 mW*0.9*7).

As described above, in the laser module of the present embodiment, by setting usage amounts of organic adhesive in the volume to be sealed to be 1.0 g/ml or less, an equilibrium density of outgas components from the adhesive when an air removal treatment has been carried out can be made to be less than 1000 ppm. Consequently, the amounts of decomposed material generated by decomposition of the outgas components by laser light are made smaller, and deterioration of the module can be suppressed remarkably. Thus, the reliability of the laser module is improved, and high output for long durations can be maintained. Moreover, by including minute amounts of oxygen in the sealed atmosphere, deterioration of the laser module can be further suppressed.

According to the present invention, the effects of deterioration of laser characteristics being effectively suppressed and reliability of a laser module being improved are obtained.

Now, a second embodiment of the present invention will be described in detail using the drawings.

Figure 8:
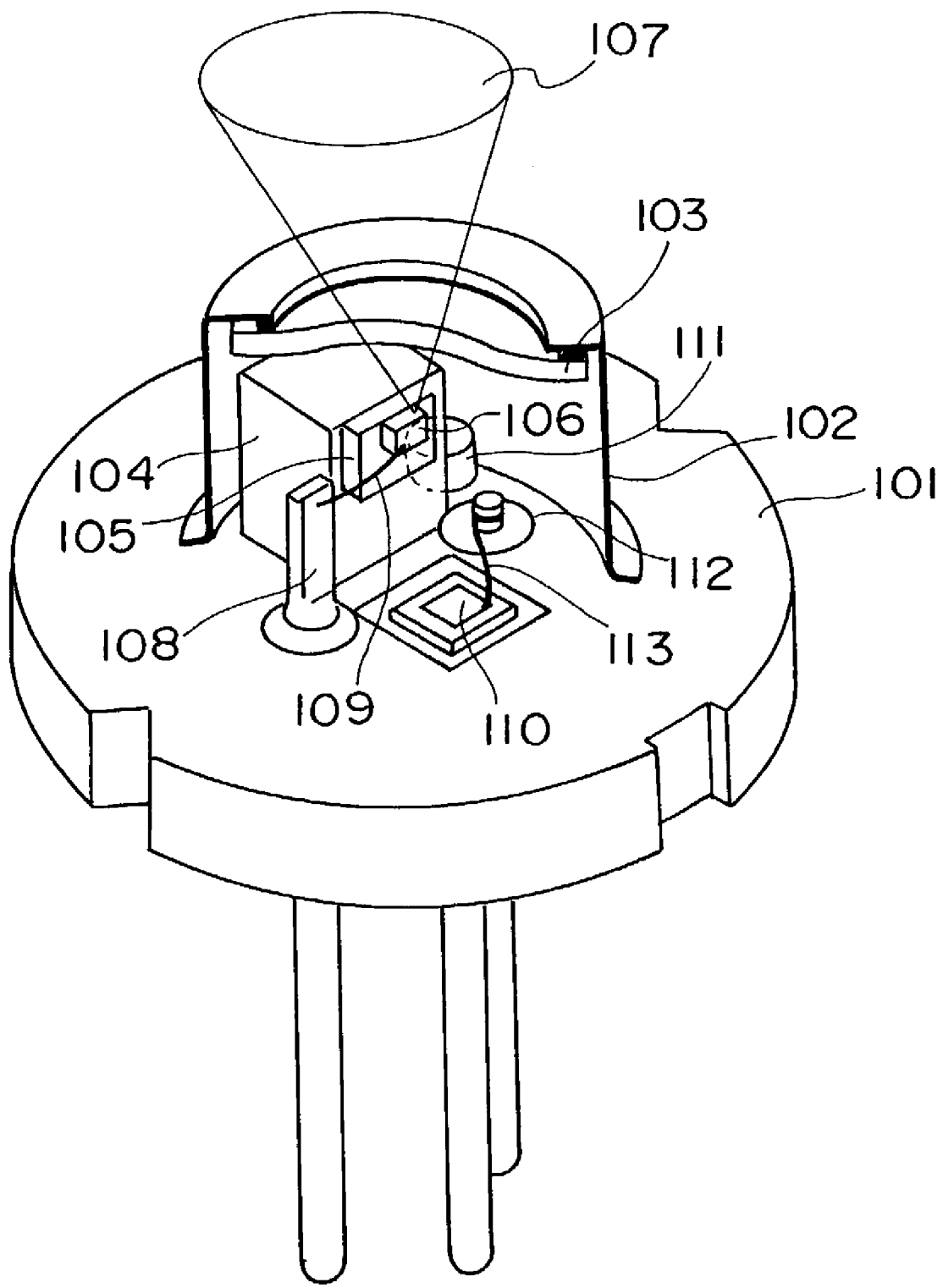
FIG. 8 is a schematic structural diagram showing a laser module according to a second embodiment of the present invention.

A can-form sealed laser module according to the second embodiment of the present invention will be described. FIG. 8 shows a schematic structural view of this laser module, FIG. 9A shows a schematic plan view, and FIG. 9B shows a schematic side view.

As shown in FIG. 8, in the laser module according to the present embodiment, a heat sink 104, an electrode terminal 108 and a monitoring photodiode 110 are fixed on a stem 101. A semiconductor laser element 106 on a submount 105 is adhered to the heat sink 104. The electrode terminal 108 is connected with the semiconductor laser element 106 by a wire 109. The monitoring photodiode 110 is connected to an electrode terminal 112 by a wire 113. Furthermore, a single zeolite adsorbent 111 is fixed on the stem 101 by an inorganic adhesive. These components are covered by a container 102 which is provided with a glass window 103 to which a non-reflective coating has been applied, and are sealed by ring-welding in a dry air atmosphere ($N_2$=80%, $O_2$=20%). An internal volume of the container 102 is 67.5 mm$^3$.

As shown in FIGS. 9A and 9B, the zeolite adsorbent 111 is disposed on the stem 101 between the container 102 and the heat sink 104. As shown in FIG. 9C, the zeolite adsorbent 111 that is employed is molded in a circular column form with diameter (x) 1.5 mm and height (y) 1.5 mm. The position at which the zeolite adsorbent 111 is disposed is not limited to the position mentioned above, and may be any location in the container as long as that location does not interfere with laser oscillations.

For the zeolite adsorbent 111, ZEOLUM F9 HA produced by TOSOH CORPORATION is a preferable zeolite adsorbent. This ZEOLUM F9 HA is formed of a crystalline hydrated aluminosilicate salt of an alkaline earth or an alkaline earth metal (Me/x.$Al_2O_3$.mSi$O_2$.n$H_2O$ with Me being a metallic ion with valency x). It is desirable that the amount of the zeolite adsorbent 111 is determined with consideration of the volume inside the container, an estimated amount of contaminant materials, adsorbance ability of the zeolite adsorbent 111, and the like.

As the adhesive for adhering the zeolite adsorbent 111 in the present embodiment, an inorganic adhesive is used. However, either or both of an organic adhesive and an inorganic adhesive may be used.

In FIG. 8, in order to assist comprehension of component structures in the container, the front half of the circular tube-form container 102 is not shown.

The can-form sealed laser module according to the present embodiment emits laser light 107, which is light that is emitted forward from the semiconductor laser element 106, through the glass window 103 to which the non-reflection coating has been applied. A light emission amount of light that is emitted rearward from the semiconductor laser element 106 is sensed by the monitoring photodiode 110, and current is automatically controlled such that the output of the laser light 107 is a certain amount.

Figure 10:
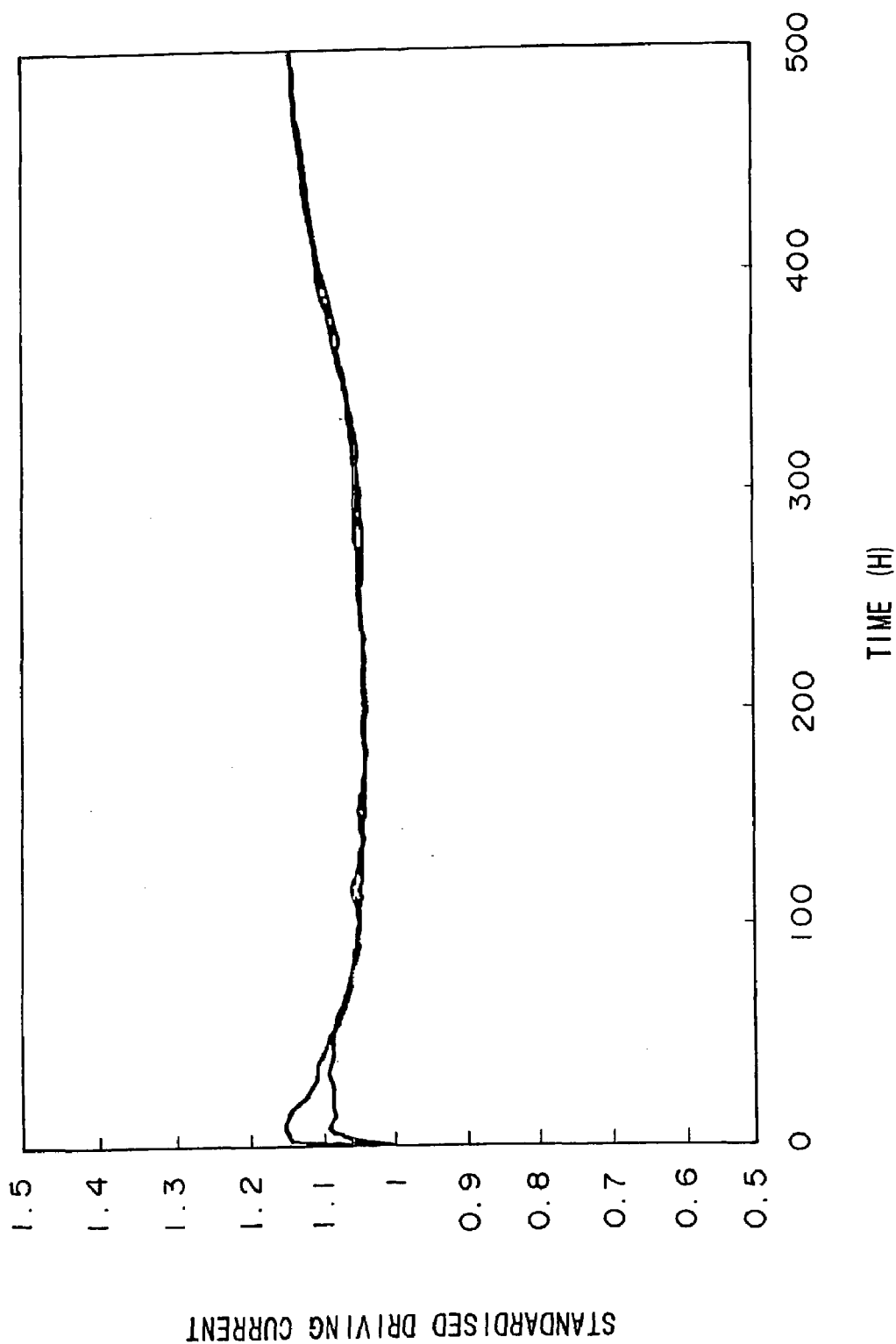
FIG. 10 is a graph showing variation over time of driving current in a laser module according to a conventional example.

Next, an evaluation of reliability over time of a laser module according to the present invention and a laser module of a conventional example has been carried out. FIG. 10 shows a graph of variations over time of driving current in the laser module of the conventional example, and FIG. 11 shows a graph of variations over time of driving current in a laser module of the present invention. Note that the vertical axes of the graphs are driving current values which have been normalized with reference to initial driving currents.

For the laser module of the present invention, the semiconductor laser element 106, having an oscillation wavelength of 405 nm, was employed in a laser module according to the second embodiment. For the laser module of the conventional example, a laser module was used that was the same as the second embodiment except that the zeolite adsorbent 111 was not provided. The sealed atmospheres in the laser modules of the conventional example and of the present invention were both dry air ($N_2$=80%, $O_2$=20%). The evaluation was carried out by adjusting driving currents such that light output was 30 mW, in an ambient temperature of 25° C.

With the laser module of the conventional example, as shown in FIG. 10, variations of the driving current over time were observed. However, with the laser module of the present invention, as shown in FIG. 11, an increase in the driving current was not observed, and the driving current was stable over time. Hence, it was seen that adherence to of contaminant materials such as hydrocarbon compounds to end faces of the semiconductor laser, optical components and the like could be excellently prevented by incorporating the adsorbent in the module, and stable laser characteristics could be obtained.

Next, a laser module according to a third embodiment of the present invention will be described. A schematic side view and plan view of this laser module are shown in FIGS. 12A and 12B.

Figure 12A:
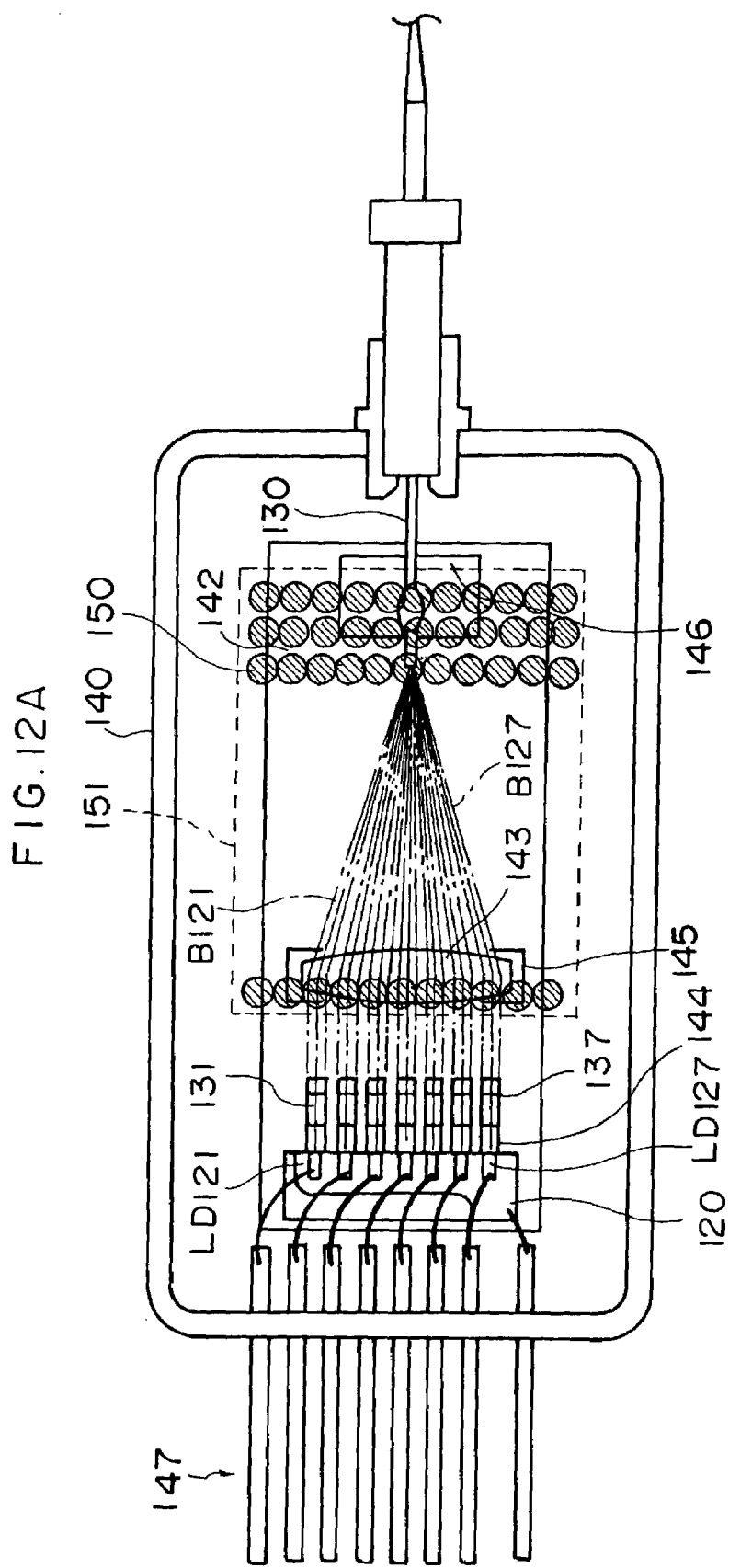

As shown in FIGS. 12A and 12B, in the laser module according to the present embodiment, a base plate 142 is fixed at a floor face of a container 140. A heat block 120, collimator lenses 131, 132, 133, 134, 135, 136 and 137, a condensing lens 143 and a multimode optical fiber 130 are fixedly disposed on the base plate 142. Seven GaN-related semiconductor laser elements LD121, LD122, LD123, LD124, LD125, LD126 and LD127 are adhered to the heat block 120. The collimator lenses 131 to 137 are held at collimator lens holders 144, which are attached to the heat block 120. The condensing lens 143 is held at a condensing lens holder 145, and the multimode optical fiber 130 is held at a fiber holder 146. Openings are formed in a wall face of the container 140. Wiring 147, which supplies driving current to the GaN-related semiconductor laser elements LD121 to LD127, passes through these openings and is led out to outside the container 140.

The container 140 is provided with a lid 141 prepared so as to close this opening. One hundred twenty zeolite adsorbents 150, which have circular column forms with diameter 1.5 mm and height 1.5 mm, are fixed with inorganic adhesive in a 10-by-12 array at a region of a rear face of the lid 141. After the semiconductor laser elements, optical members and the like have been disposed in the container, the container 140 is adhered to the lid 141 and sealed, with an atmosphere of dry air ($N_2$=80%, $O_2$=20%). Internal volume of the container 140 is 8,160 mm$^3$. Similarly to the second embodiment described above, ZEOLUM F9 HA produced by TOSOH CORPORATION is used for the zeolite adsorbents 150.

Each of the collimator lenses 131 to 137 has a long, narrow, cut-down shape with parallel flat faces defining a region that includes an optical axis of a circular-form lens which is provided with an aspherical surface. The collimator lenses with this long, narrow shape can be formed, for example, by molding-formation of resin or optical glass. The collimator lenses 131 to 137 are closely disposed in a direction of arrangement of light emission points of the GaN-related semiconductor laser elements LD121 to LD127 such that the length directions of the collimator lenses 131 to 137 cross the direction of arrangement of the light emission points.

In FIG. 12A, in order to alleviate complexity of the drawing, of the plurality of GaN-related semiconductor lasers, only the GaN-related semiconductor lasers LD121 and LD127 are marked with reference numerals, and of the plurality of collimator lenses, only the collimator lenses 131 and 137 are marked with reference numerals.

For the GaN-related semiconductor laser elements LD121 to LD127, lasers may be employed which are provided with an active layer with a light emission width of 2 μm, and respectively emit laser beams B121 to B127 in forms which widen at angles of, for example, 10° and 30° with respect, respectively, to a direction parallel to the active layer and a direction perpendicular to the active layer. These GaN-related semiconductor laser elements LD121 to LD127 are disposed such that the light emission points are lined up in a single row in the direction parallel to the active layers.

Accordingly, the laser beams B121 to B127 emitted from the respective light emission points are incident on the respective collimator lenses 131 to 137 having the long, narrow forms described above in states in which the direction for which the spreading angle is greater coincides with the length direction and the direction in which the spreading angle is smaller coincides with a width direction (a direction intersecting the length direction). Specifically, the width of each of the collimator lenses 131 to 137 is 1.1 mm and the length thereof is 4.6 mm, and the laser beams B121 to B127 incident thereat have beam diameters in the horizontal direction and the vertical direction of 0.9 mm and 2.6 mm, respectively. Further, each of the collimator lenses 131 to 137 has a focusing length $f_1=3$ mm, NA=0.6 and lens arrangement pitch=1.25 mm.

The condensing lens 143 is cut away in a long, narrow shape with parallel flat faces defining a region that includes an optical axis of a circular-form lens which is provided with an aspherical surface, and is formed in a shape which is long in the direction of arrangement of the collimator lenses 131 to 137 (i.e., a horizontal direction) and short in a direction perpendicular thereto. The condensing lens 143 has a focusing distance $f_2=12.5$ mm and NA=0.3. The condensing lens 143 is also formed by, for example, molding-formation of resin or optical glass.

The multimode optical fiber 130 may be any of a step index-type optical fiber, a graded index-type optical fiber and a multiplex-type optical fiber. For example, a graded index-type optical fiber produced by MITSUBISHI CABLE INDUSTRIES, LTD. can be employed. This optical fiber has a core central portion with a graded index and an outer peripheral portion with a step index. A core diameter thereof=25 μm, NA=0.3, and transmittance of an end face coating=99.5% or more.

With the third embodiment, similarly to the second embodiment described above, it has been confirmed that an increase in driving current over time is not observed, and the driving current is stable.

In a case in which an organic adhesive is used for adhesion of the adsorbents, organic gas components generated from the adhesive are present in the module. However, in a laser module according to the third embodiment, whereas eliminating organic gas and the like by an air removal treatment was proposed in patent application Ser. No. 2002-101714, if the circular column form zeolite adsorbent 111 with diameter 1.5 mm and height 1.5 mm is incorporated for the zeolite adsorbents 150, organic gases and the like are excellently adsorbed by the adsorbents even with sealing without carrying out an air removal treatment. Accordingly, favorable laser characteristics and reliability over time can be provided without increasing production steps and production costs.

In the second and third embodiments, a zeolite adsorbent is employed as the adsorbent. However, activated carbon, or both a zeolite adsorbent and activated carbon, may be employed, and effects the same as in the case of the zeolite adsorbent can be obtained. In a case of using activated carbon too, inorganic or organic adhesive may be used for fixing the adsorbent in the container. Adsorbents formed of other compounds may also be employed as materials having a gas adsorption function.

According to the present invention, contaminant materials such as hydrocarbons and the like that are present in a container in which a semiconductor laser element is sealed can be excellently removed, and thus a laser module with high reliability can be provided.

Now, a fourth embodiment of the present invention will be described in detail using the drawings.

Figure 13:
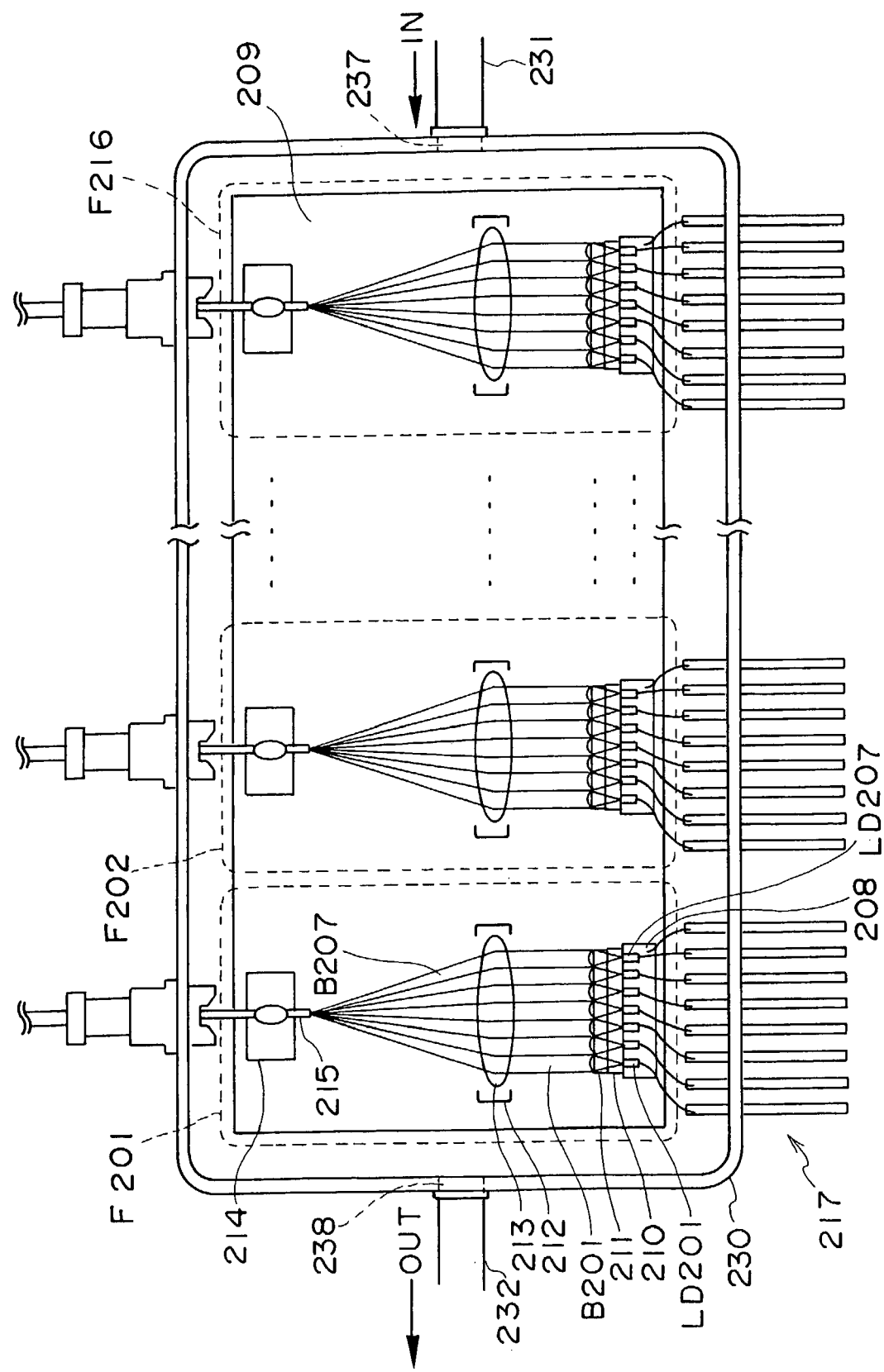
FIG. 13 is a schematic plan view showing a laser module according to a fourth embodiment of the present invention.
Figure 16:
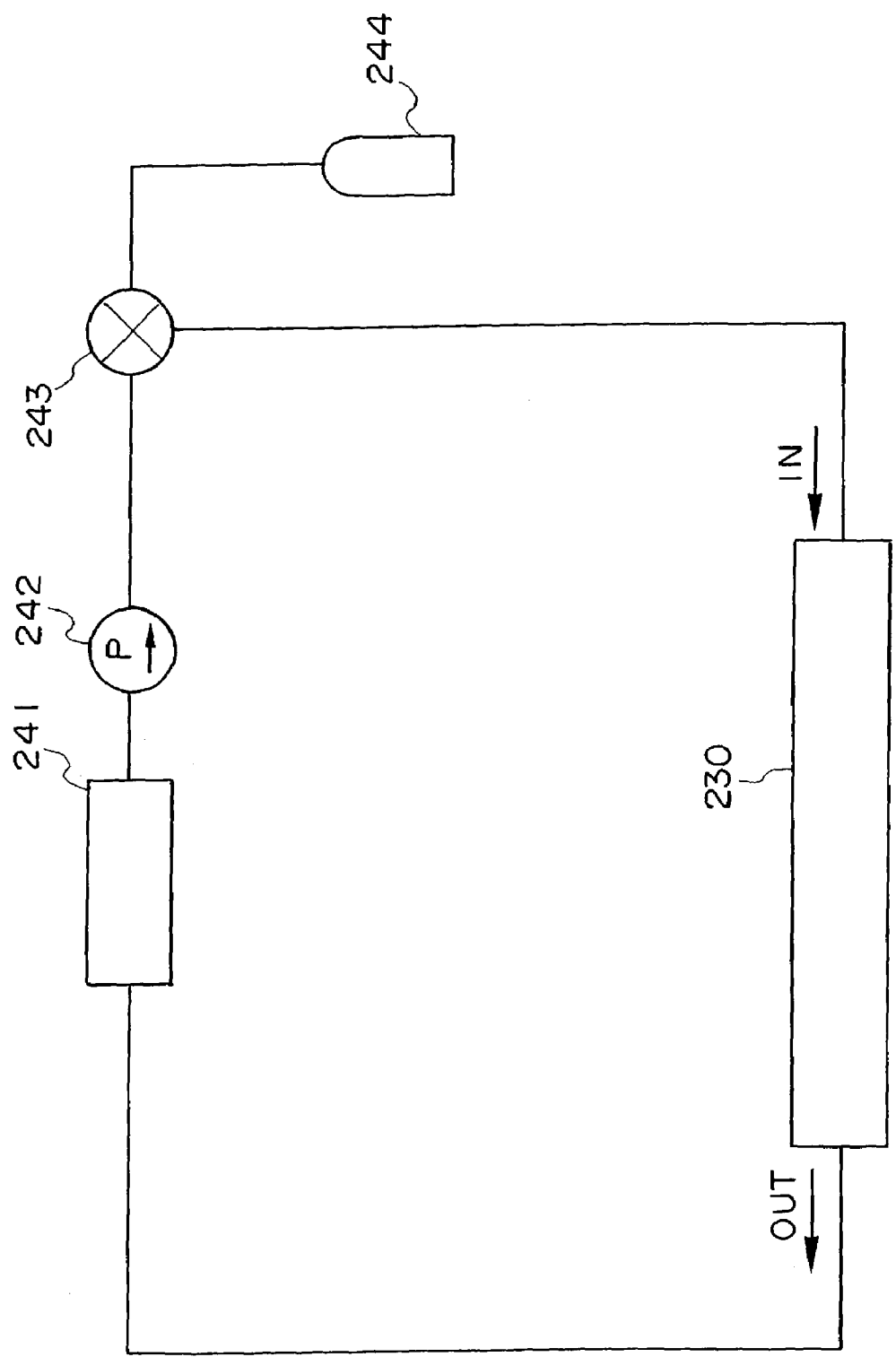
FIG. 16 is a system diagram showing an air circulation apparatus provided to the laser module according to the fourth embodiment of the present invention.

A laser apparatus according to the fourth embodiment of the present invention will be described. FIG. 13 shows a schematic plan view of this laser apparatus, FIG. 14 shows a side view of the same, FIGS. 15A and 15B show a front view and a rear view, and FIG. 16 shows an air circulation path.

As shown in FIG. 13, in the laser apparatus according to the present fourth embodiment, sixteen multiplexed lasers F201 to F216 are disposed in a container 230 in a state in which emission ends of multimode optical fibers 215 are passed out to outside the container 230. The container 230 has an air supply port 237 and an air exhaust port 238. The multiplexed lasers F201 to F216 are each formed with seven chip-form lateral single-mode, single-cavity GaN-related semiconductor lasers LD201, LD202, LD203, LD204, LD205, LD206 and LD207, a microlens array 211, a condensing lens 213, and one of the multimode optical fibers 215. The GaN-related semiconductor lasers LD201 to LD207 are fixedly arranged on a heat block (radiator block) 208 formed of copper or a copper alloy. The air supply port 237 and air exhaust port 238 are connected with pipes 231 and 232, respectively, which communicate with an air circulation apparatus.

A base plate 209 is fixed to a floor face inside the container 230. The heat blocks 208 are attached to an upper face of the base plate 209. Lens holders 210, which hold the microlens arrays 211, are fixed to the heat blocks 208. Condensing lens holders 212, which hold the condensing lenses 213, and fiber holders 214, which hold incidence end portions of the multimode optical fibers 215, are also fixed to the upper face of the base plate 209. Wiring groups 217, which supply driving current to the GaN-related semiconductor laser elements LD201 to LD207, are passed out to the outside of the container through openings formed in a side wall face of the container 230.

Figure 14:
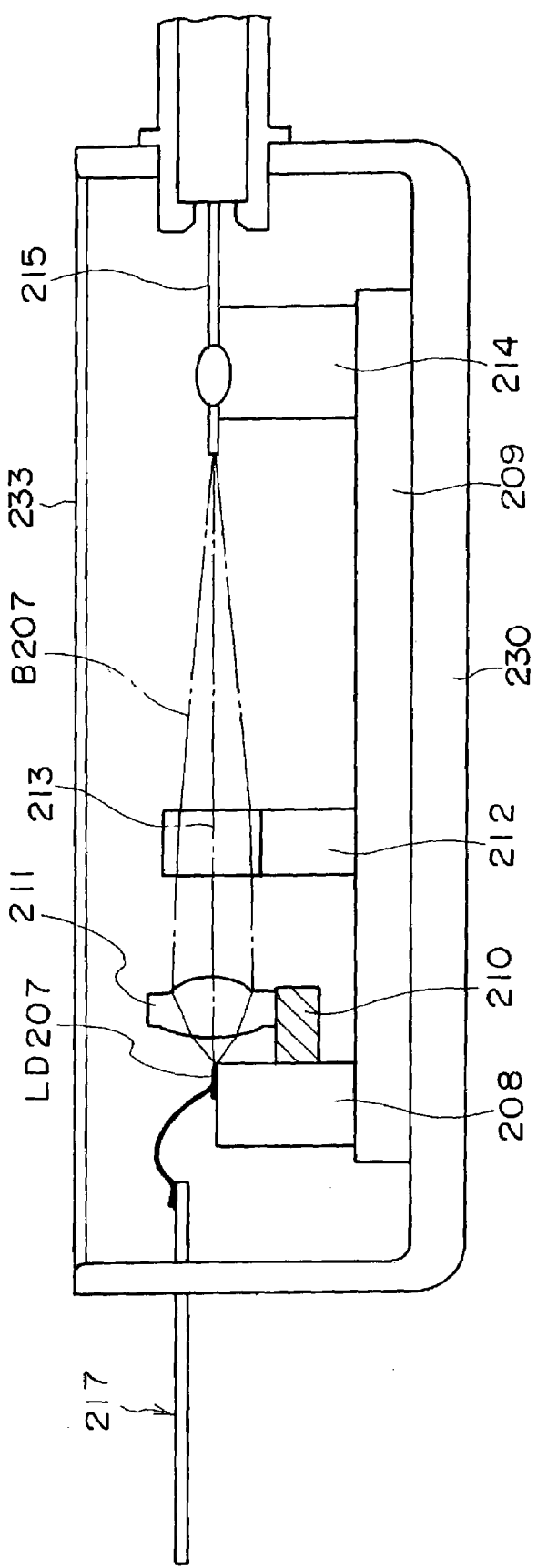
FIG. 14 is a side view showing an implementation of the laser module according to the fourth embodiment of the present invention.

As shown in FIG. 14, a lid 233 is soldered on at an upward opening of the container 230.

In FIG. 14, in order to alleviate complexity of the drawing, of the plurality of GaN-related semiconductor laser elements LD201 to LD207, only the GaN-related semiconductor laser element LD207 is marked with a reference numeral, and of laser beams B201 to B207, only B207 is marked with a reference numeral.

In the laser apparatus according to the present, fourth, embodiment, as shown in FIGS. 15A and 15B, the multimode optical fibers 215 are passed out, lined up in a single row, at one side face (a front face side) of the container 230. At a side face opposite thereto (a rear face side), the wiring groups 217 are similarly passed out in a line. The air supply port 237, which communicates with the pipe 232, and the air exhaust port 238, which communicates with the pipe 231, are provided at side faces that are orthogonal to the side faces at which the multimode optical fibers 215 and wiring groups 217 of the container 230 are drawn out. Note that the container 230 is disposed on an unillustrated peltier element.

Further, as shown in FIG. 16, this laser apparatus is provided with an air circulation apparatus formed with a filter 241 for removing contaminant materials, a rotary pump 242 which circulates an inactive gas, and a valve 243 for adjusting the replenishment of air from a storage cylinder 244. The inactive gas is circulated through the interior of the container 230.

The inactive gas may be made to circulate in conjunction with driving of the semiconductor laser elements LD201 to LD207, using a drive control circuit or the like, or may be made to flow continuously. Further, the inactive gas may be made to flow for a certain duration before the semiconductor laser elements are driven.

As the inactive gas that flows in the container 230, any of a noble gas such as argon or the like, nitrogen (with 99.99% purity), a mixed gas of nitrogen and oxygen (with an oxygen density of 1 ppm or more), and a mixed gas, which is a mixture of nitrogen, oxygen at a density of 1 ppm or more and one or more of halogen family gases and halogen compound gases, may be employed.

If oxygen is included in the flowed gas at 1 ppm or more, deterioration of the laser module can be suppressed. This deterioration suppression effect is obtained because the oxygen that is included oxidizes and decomposes solid matter that is generated by photodecomposition of hydrocarbon components. If the oxygen density is less than 1 ppm, this deterioration suppression effect is not obtained. If the oxygen density is too high, photochemical reactions of organic silicon compound gases will be accordingly accelerated. Thus, the oxygen density in the inactive gas that is flowed may be in a range of 1 to 800 ppm, and will often be in a range of 1 to 100 ppm.

Halogen family gases means halogen gases such as chlorine gas ($Cl_2$), fluorine gas ($F_2$) and the like. Halogen compound gases means gaseous compounds that contain halogen atoms such as chlorine atoms (Cl), bromine atoms (Br), iodine atoms (I), fluorine atoms (F) and the like.

Examples of halogen compound gases include $CF_3Cl$, $CF_2Cl_2$, $CFCl_3$, $CF_3Br$, $CCl_4$, $CCl_4$—$O_2$, $C_2F_4Cl_2$, $Cl$—$H_2$, $PCl_3$, $CF_4$, $SF_6$, $NF_3$, $XeF_2$, $C_3F_8$, $CHF_3$ and the like. Compounds of fluorine or chlorine with carbon (C), nitrogen (N), sulfur (S) or xenon (Xe) may be employed, and compounds that include fluorine atoms will often be employed.

Halogen-type gases exhibit a deterioration suppression effect from very small amounts, but in order to obtain a remarkable deterioration suppression effect, an inclusion density of halogen-type gas may be set to 1 ppm or more. This deterioration suppression effect is obtained because the halogen-type gas that is included in the flowing gas atmosphere decomposes deposits that have been generated by photodecomposition of organic silicon compound gases.

In a case in which a material that is employed for outermost faces covering optical components is a material that has reactivity with the halogen-type gas, such as an oxide or nitride of silicon (Si), molybdenum (Mo), chromium (Cr), tin (Sn) or zirconium (Zr), or the like, the outermost face layers of these optical components will be subjected to etching, and reliability of the module will fall.

Accordingly, resonator end faces of the semiconductor laser elements, the multimode optical fiber incidence faces and foremost surface layers covering the condensing optical systems, which are exposed to the inactive gas flowing in the container, may employ materials that are inactive with respect to the halogen-type gas, such as oxides and nitrides of indium (In), gallium (Ga), aluminium (Al), titanium (Ti) and tantalum (Ta).

For the filter 241, a filter loaded with an adsorbent may be employed.

As the adsorbent, a zeolite adsorbent, activated carbon, or both a zeolite adsorbent and activated carbon may be employed. As a zeolite adsorbent, ZEOLUM F9 HA produced by TOSOH CORPORATION is preferable. This ZEOLUM F9 HA is formed of a crystalline hydrated aluminosilicate salt of an alkaline earth or an alkaline earth metal ($Me/x.Al_2O_3.mSiO_2.nH_2O$ with Me being a metallic ion with valency x). An amount of the zeolite adsorbent may be determined in consideration of volume inside the container, expected contaminant materials, adsorbance ability of the zeolite adsorbent and the like. Further, the adsorbent is not limited to zeolite-type adsorbents, and adsorbents formed with other compositions may be employed.

Furthermore, a catalyst such as Pt, Pd or the like may be added at the filter in which the adsorbent is loaded, and the filter may be heated to 500° C. so as to decompose hydrocarbon compounds.

Although the semiconductor laser elements LD201 to LD207 are disposed in a one-dimensional pattern in the present embodiment, as viewed from an emission direction, the same may be arranged in a two-dimensional pattern. In such a case, a microlen array that is arranged in a two-dimensional pattern may be employed.

Seven collimator lenses, which are individually held by holders in a one-dimensional pattern, may be employed instead of the microlens array 211.

The filter 241 is provided only at the exhaust port side of the container 230. However, the filter 241 may be further provided between the valve 243 and the air supply port 237.

Temperature adjustment is implemented by the peltier element. However, temperature adjustment using water-cooling is also possible.

As shown in FIG. 13, the GaN-related semiconductor lasers LD201 to LD207 have a common oscillation wavelength, for example, 400 nm, and all have a common maximum output of 50 mW. The laser beams B201, B202, B203, B204, B205, B206 and B207, which are emitted in divergent forms from the GaN-related semiconductor lasers LD201, LD202, LD203, LD204, LD205, LD206 and LD207, are respectively converted to parallel light by the microlens array 211.

The laser beams B201 to B207 that have been collimated are condensed by the condensing lens 213, and converge at incidence end faces of a core of the multimode optical fiber 215. In the present example, the condensing optical system is structured by the microlens array 211 and the condensing lens 213, and a multiplexing optical system is structured by the condensing optical system and the multimode optical fiber 215. Thus, the laser beams B201 to B207 condensed by the condensing lens 213 as described above are incident at the core of the multimode optical fiber 215, are propagated in the multimode optical fiber 215, and are multiplexed and emitted as a single laser beam.

For the GaN-related semiconductor laser elements LD201 to LD207, lasers with a light emission width of 1 μm may be employed, which respectively emit the laser beams B201 to B207 in forms which spread at angles of, for example, 10° and 30° with respect, respectively, to a direction parallel to active layers and a direction perpendicular to the active layers. These GaN-related semiconductor laser elements LD201 to LD207 are disposed such that light emission points are lined up in a single row in the direction parallel to the active layers.

In this structure, if respective lens NA (numerical apertures) of the microlens array 211 are set to 0.2 and respective convergence angles $\alpha$ of the beams from the condensing lens 213 are set to 11°, then a convergence spot diameter of the laser beams B201 to B207 on the core of the multimode optical fiber 215 will be approximately 18 μm. Thus, given that outputs of the GaN-related semiconductor lasers LD201 to LD207 are all 50 mW, the output of the multiplexed laser beam will be 350 mW. Further, because the sixteen multimode optical fibers having outputs of 350 mW are arrayed in this laser apparatus, a high output of 350 mW*16=5.6 W can be obtained.

The GaN-related semiconductor lasers LD201 to LD207 may be fixed on submounts formed of, for example, AlN, and these may be mounted at the heat blocks 208.

For the multimode optical fibers 215, optical fiber with a core diameter=50 μm, NA=0.2 and transmittance of an end face coating=99.5% or more, based on a step index-type optical fiber produced by MITSUBISHI CABLE INDUSTRIES, LTD., is employed. In the case of this example, a value of the previously mentioned core diameter multiplied by the NA is 10 μm.

All of step index-type fibers, graded index-type fibers and compound types thereof are applicable for the multimode optical fibers 215.

Figure 17:
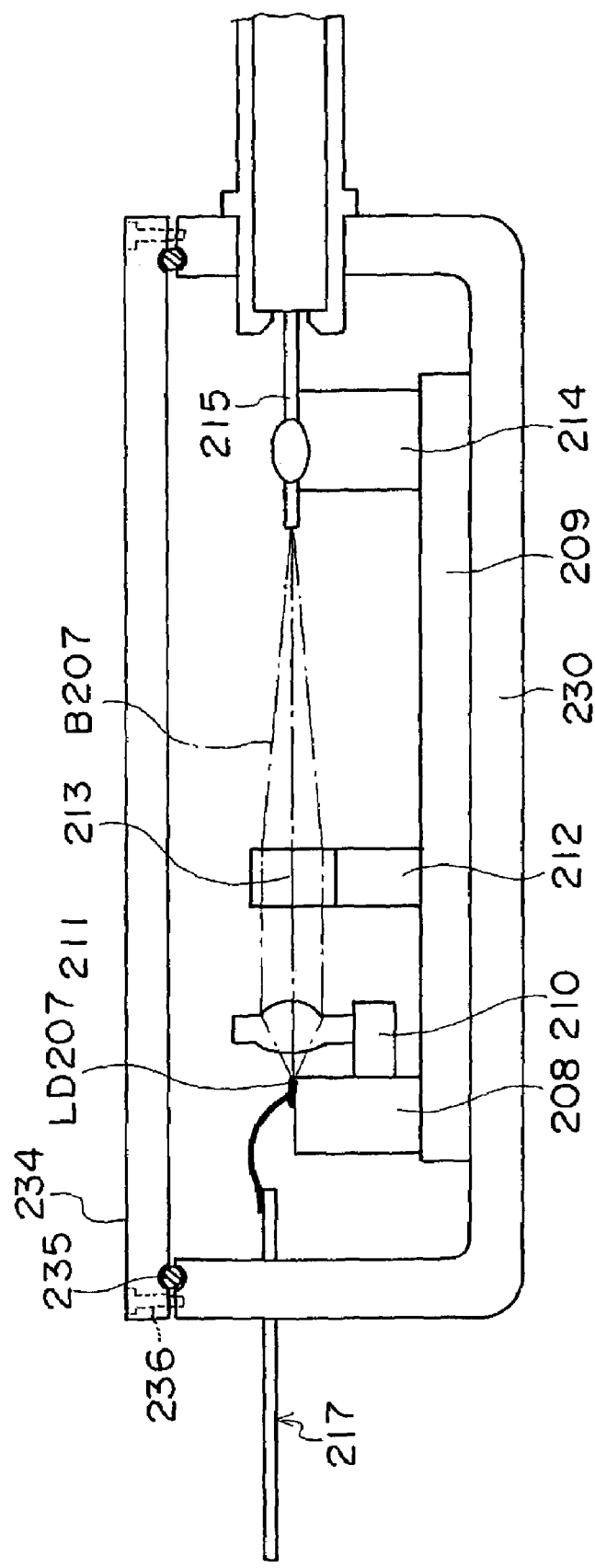
FIG. 17 is a sectional view showing an alternative mode of fixing of a lid body in the laser module according to the fourth embodiment of the present invention.

In the embodiment described above, the container 230 is metal-sealed. However, as shown in FIG. 17, hemi-cylindrical grooves may be provided at an upper face of the container 230 and a surface of a lid 234 that contacts the container 230, rubber packing 235 formed of a fluorine-based resin may be sandwiched at the grooves, and the lid 234 may be fixed to the container 230 by screws 236. When the lid 234 is fixed by screwing in this manner, the container 230 is openable and closeable. Consequently, if components in the container become damaged or inoperable, these internal components can be easily replaced by removing the lid 234.

In a laser apparatus according to the present invention, inactive gas, from which contaminant materials such as organic gases, microparticles and the like that are present in a container and an air circulation path are removed by a filter, flows in the container continuously. As a result, adherence of contaminant matter to emission end faces of semiconductor laser elements, microlens arrays, condensing lenses, incidence ends of optical fibers and the like can be excellently prevented, and high output and reliability can be obtained. Moreover, because a plurality of multiplexed lasers are disposed in one container and the inactive gas flows in that container, there is no need, as in conventional technology, to employ expensive materials such as kovar in order to increase airtightness, and fabrication with low costs is possible.

What is claimed is:

1. A laser module comprising:
   a semiconductor laser which emits laser light in a wavelength range of 350 to 450 nm; and
   a hermetic sealing member which forms a sealed space thereinside, the sealed space being charged with a sealed atmosphere in which density of an organic gas component generated from solid organic matter is less than 1000 ppm, and the semiconductor laser being hermetically sealed in the space.

2. The laser module of claim 1 further comprising: a hermetic container for accommodating the sealed space therein, and a material capable of adsorbing gas, the material being disposed in the hermetic container.

3. The laser module of claim 1, wherein an inclusion amount prior to hermetic sealing of the solid organic matter in the sealed atmosphere has been set to not more than 1 g/ml.

4. The laser module of claim 3, wherein the organic gas component generated from the solid organic matter comprises a molecular weight of at least 70 and a boiling point of at least 70° C.

5. The laser module of claim 4, wherein the organic gas component generated from the solid organic matter comprises a compound which includes at least one of a silicon atom, a phosphorus atom and a sulfur atom.

6. The laser module of claim 5, wherein the sealed atmosphere comprises inactive gas including oxygen at a density of not less than 1 ppm and not more than 100 ppm.

7. A laser module comprising:
   (a) a multiplex laser including
       a plurality of semiconductor lasers which emit laser light in a wavelength range of 350 to 450 nm,
       one optical fiber, and
       a condensing optical system which condenses laser beams respectively emitted from the plurality of semiconductor lasers and focuses the laser beams at the optical fiber; and
   (b) a hermetic sealing member which forms a sealed space thereinside, the sealed space being charged with a sealed atmosphere in which density of an organic gas component generated from solid organic matter is less than 1000 ppm, and the semiconductor lasers, a focusing side portion of the optical fiber and the condensing optical system being hermetically sealed in the space.

8. The laser module of claim 7 further comprising: a hermetic container for accommodating the sealed space therein, and a material capable of adsorbing gas, the material being disposed in the hermetic container.

9. The laser module of claim 7, wherein an inclusion amount prior to hermetic sealing of the solid organic matter in the sealed atmosphere has been set to not more than 1 g/ml.

10. The laser module of claim 9, wherein the organic gas component generated from the solid organic matter comprises a molecular weight of at least 70 and a boiling point of at least 70° C.

11. The laser module of claim 10, wherein the organic gas component generated from the solid organic matter comprises a compound which includes at least one of a silicon atom, a phosphorus atom and a sulfur atom.

12. The laser module of claim 11, wherein the sealed atmosphere comprises inactive gas including oxygen at a density of not less than 1 ppm and not more than 100 ppm.

13. A process for producing a laser module comprising the steps of:
   accommodating a semiconductor laser which emits laser light in a wavelength range of 350 to 450 nm in a sealed space inside a hermetic sealing member;
   setting an inclusion amount of solid organic matter in a volume to be sealed to be not more than 1 g/ml;
   air removal processing the space until density of an organic gas component generated from the solid organic matter is less than 1000 ppm; and
   after the air removal processing, hermetically sealing the semiconductor laser in the space.

* * * * *